United States Patent
Takashima et al.

(10) Patent No.: US 8,193,577 B2
(45) Date of Patent: Jun. 5, 2012

(54) NONVOLATILE SEMICONDUCTOR MEMORY DEVICE

(75) Inventors: Akira Takashima, Fuchu (JP); Masao Shingu, Kawasaki (JP); Naoki Yasuda, Yokohama (JP); Koichi Muraoka, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 50 days.

(21) Appl. No.: 12/506,588

(22) Filed: Jul. 21, 2009

(65) Prior Publication Data
US 2010/0072535 A1   Mar. 25, 2010

(30) Foreign Application Priority Data

Sep. 25, 2008   (JP) .................. 2008-246690

(51) Int. Cl.
*H01L 29/792* (2006.01)
*H01L 21/8238* (2006.01)
*H01L 21/336* (2006.01)

(52) U.S. Cl. ......... 257/324; 257/E21.423; 257/E29.309; 438/216; 438/287

(58) Field of Classification Search .................. 257/324, 257/E29.309, E21.423; 438/216, 287
See application file for complete search history.

(56) References Cited

U.S. PATENT DOCUMENTS

| 6,642,573 B1 * | 11/2003 | Halliyal et al. ............... 257/316 |
| 6,693,321 B1 * | 2/2004 | Zheng et al. .................. 257/314 |
| 7,365,389 B1 * | 4/2008 | Jeon et al. ..................... 257/325 |
| 2008/0121978 A1 * | 5/2008 | Sawamura .................... 257/321 |
| 2008/0121987 A1 * | 5/2008 | Chen ............................. 257/328 |
| 2009/0057751 A1 | 3/2009 | Ariyoshi et al. |

FOREIGN PATENT DOCUMENTS

| JP | 2003-68897 | 3/2003 |
| JP | 2006-203200 | 8/2006 |

OTHER PUBLICATIONS

U.S. Appl. No. 12/234,197, filed Sep. 19, 2008, Masao Shingu, et al.
U.S. Appl. No. 12/388,040, filed Feb. 18, 2009, Keiko Ariyoshi, et al.

* cited by examiner

*Primary Examiner* — Zandra Smith
*Assistant Examiner* — Jeremy Joy
(74) *Attorney, Agent, or Firm* — Oblon, Spivak, McClelland, Maier & Neustadt, L.L.P.

(57) ABSTRACT

A nonvolatile semiconductor memory device includes a source region and a drain region provided apart from each other in a semiconductor substrate, a first insulating film provided on a channel region between the source region and the drain region, a charge storage layer provided on the first insulating film, a second insulating film provided on the charge storage layer and including a stacked structure of a lanthanum aluminum silicate film and a dielectric film made of silicon oxide or silicon oxynitride, and a control gate electrode provided on the second insulating film.

6 Claims, 19 Drawing Sheets

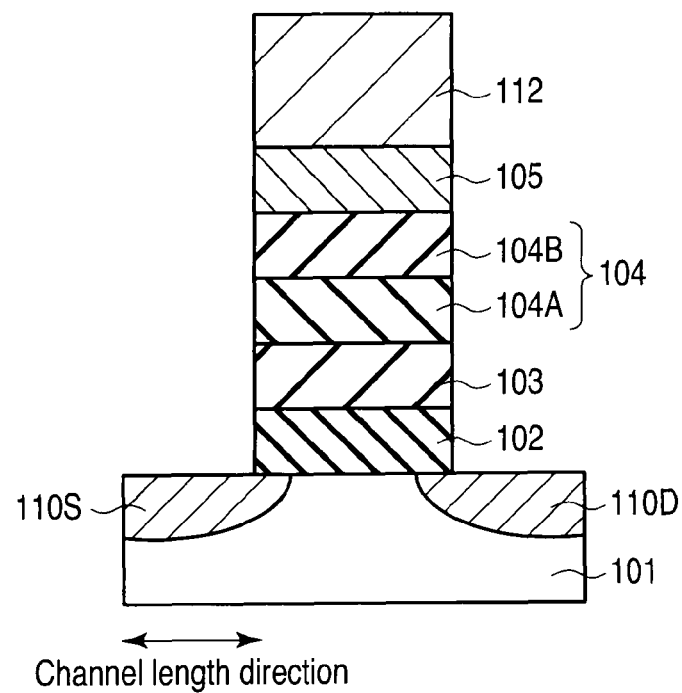
F I G. 1
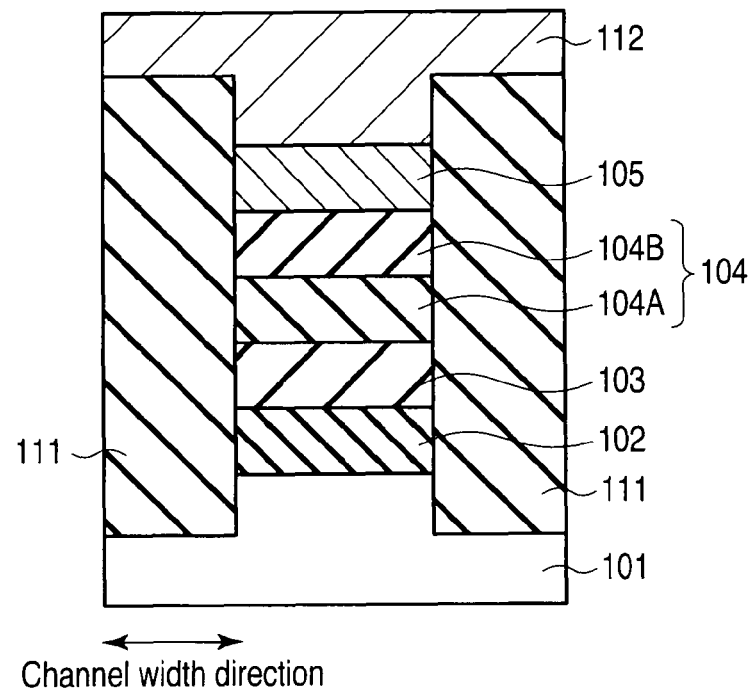
F I G. 2

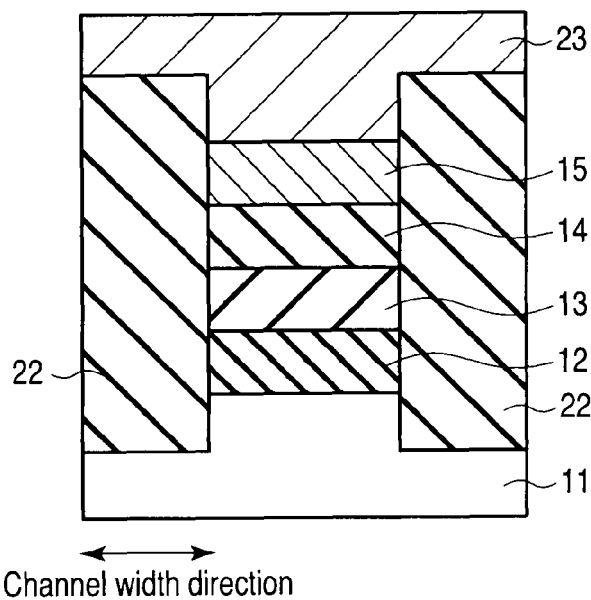
Channel width direction
F I G. 5
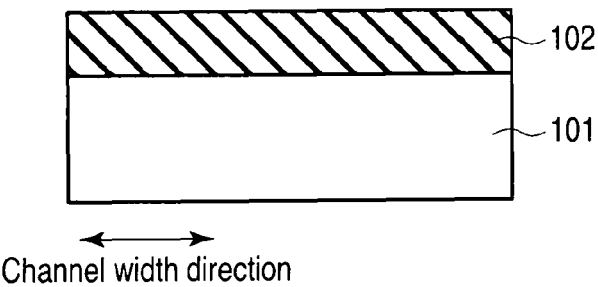
Channel width direction
F I G. 6
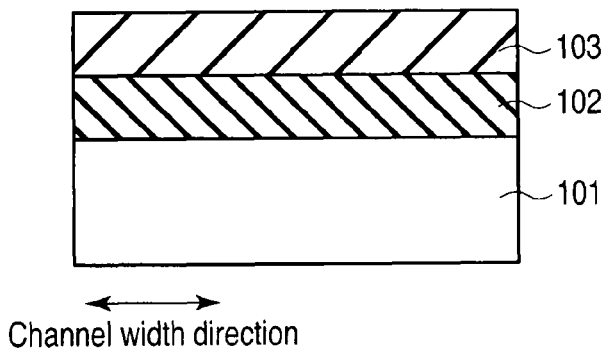
Channel width direction
F I G. 7

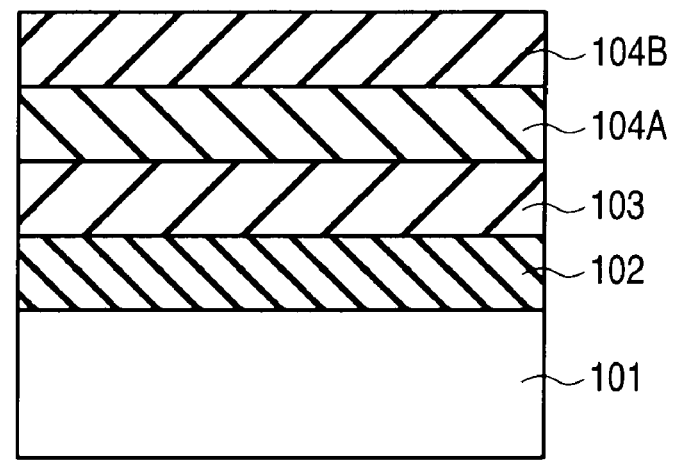
Channel width direction
F I G. 8
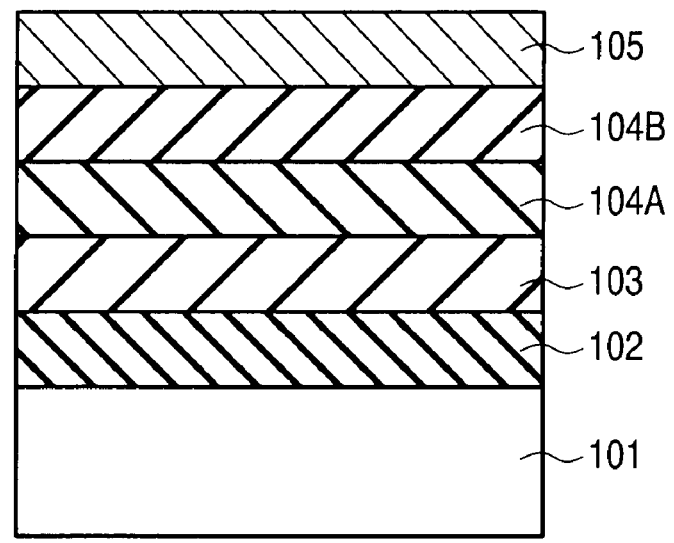
Channel width direction
F I G. 9

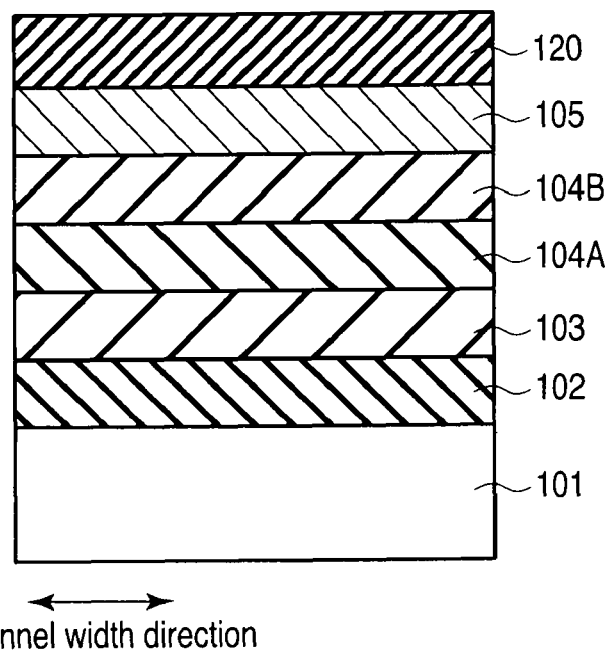
Channel width direction
F I G. 10
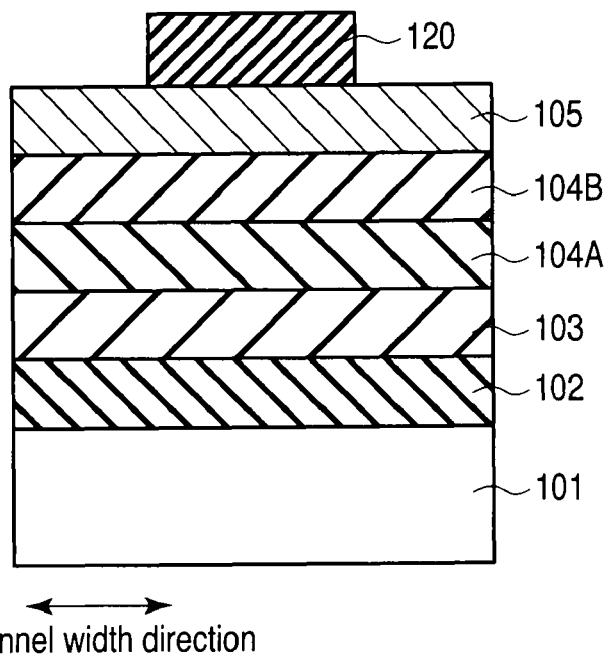
Channel width direction
F I G. 11

Channel length direction

Channel length direction

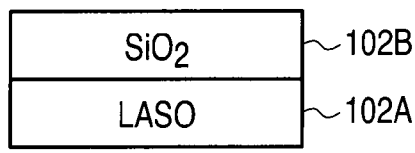
F I G. 24A
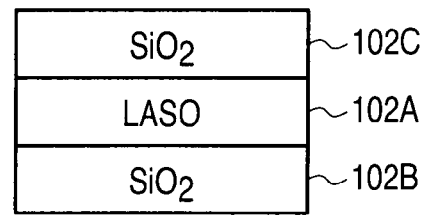
F I G. 24C
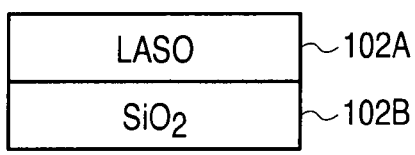
F I G. 24B
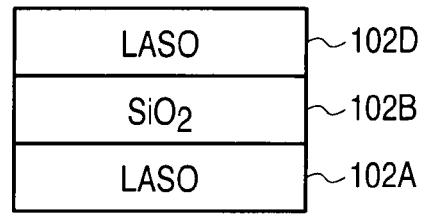
F I G. 24D
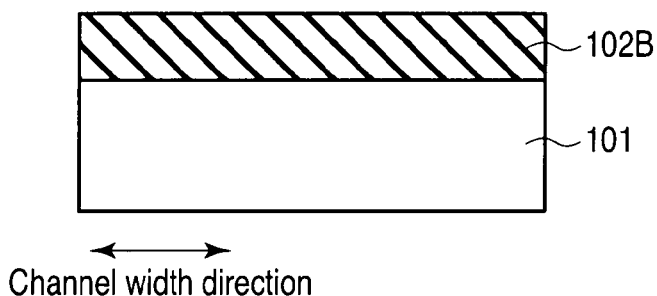
F I G. 25
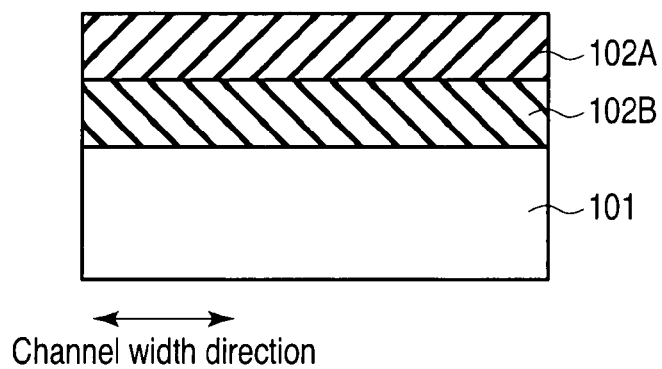
F I G. 26

Channel width direction

Channel width direction

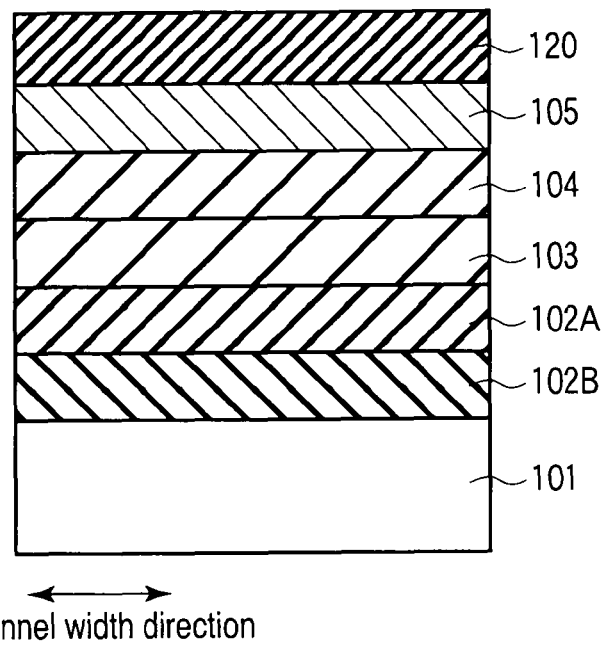
Channel width direction
F I G. 29
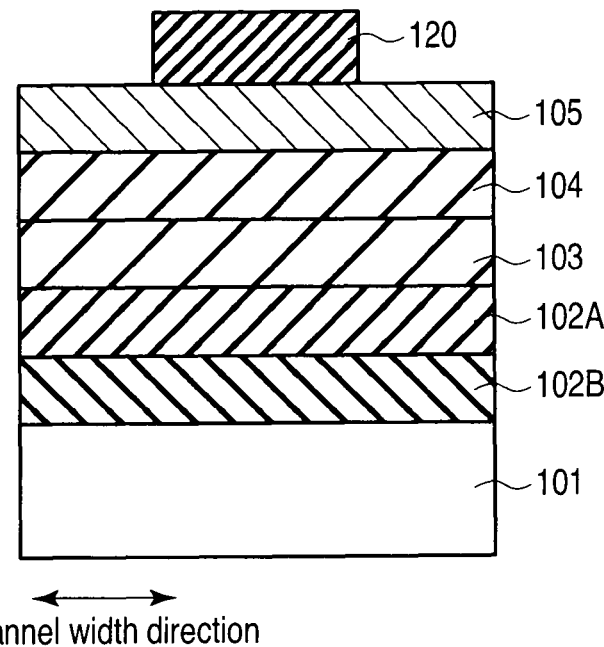
Channel width direction
F I G. 30

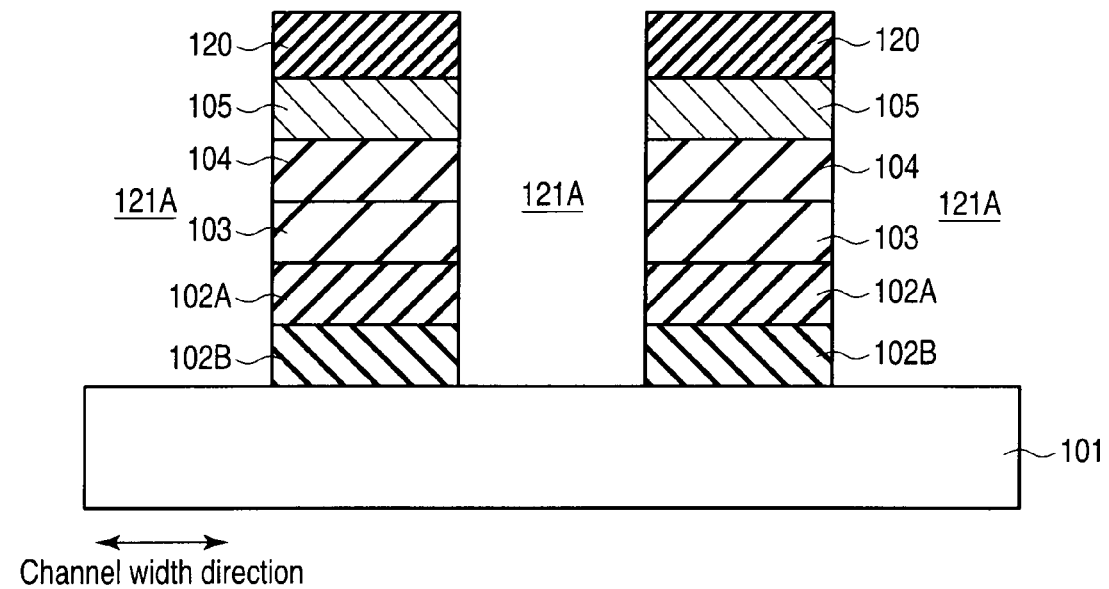
Channel width direction
F I G. 31
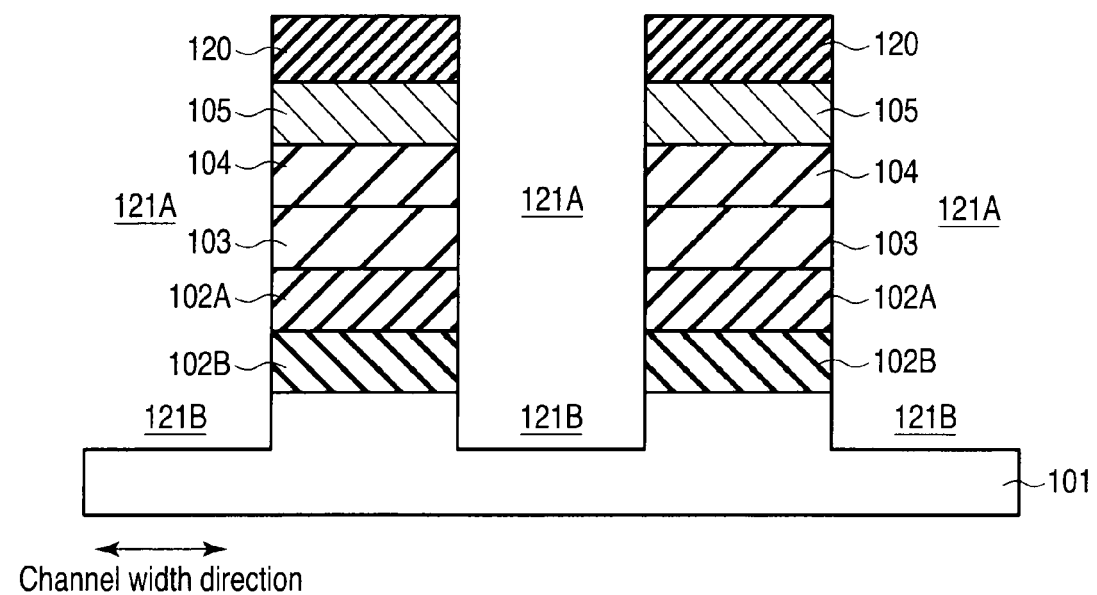
Channel width direction
F I G. 32

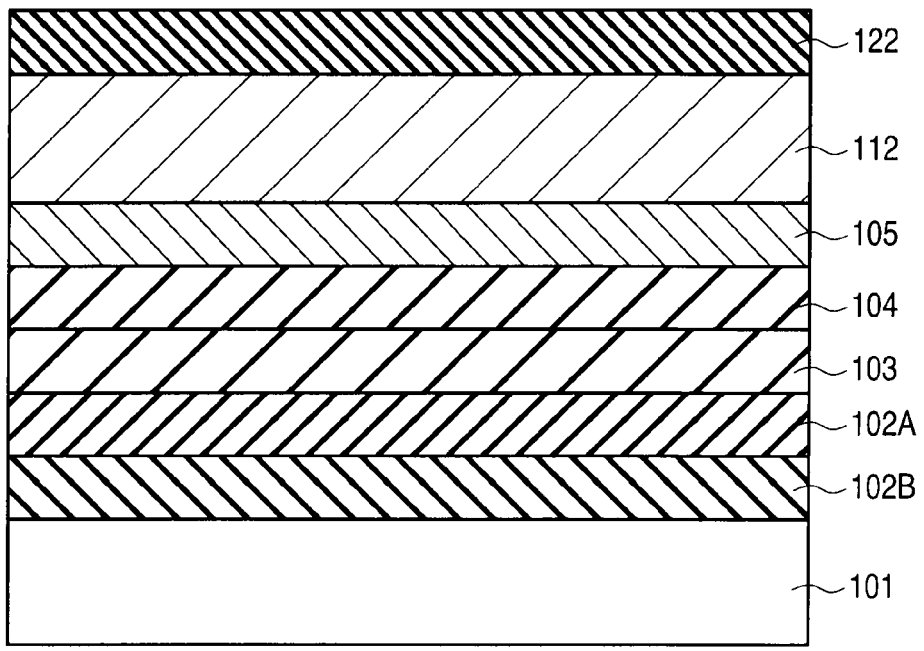
F I G. 37
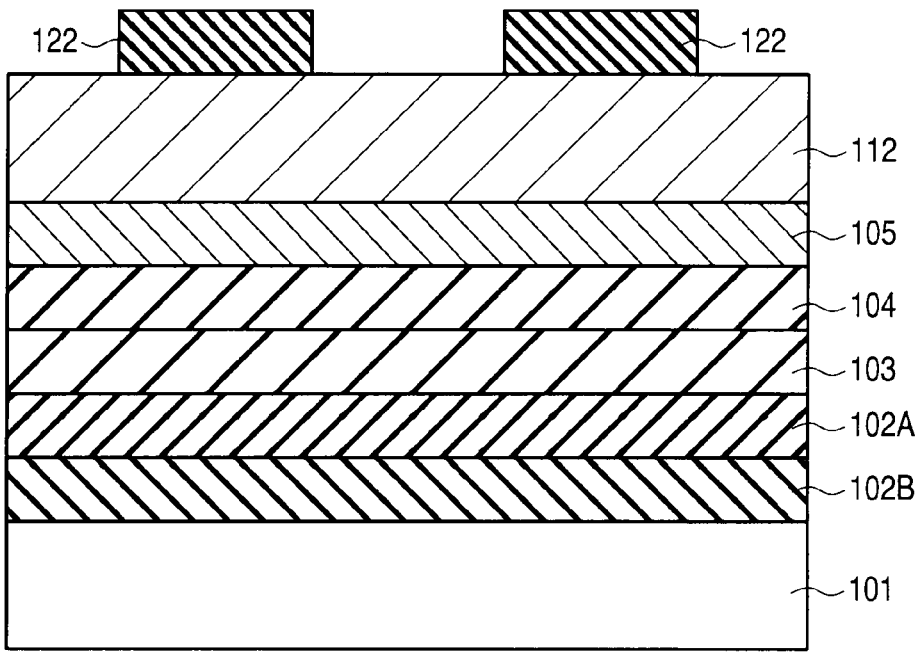
F I G. 38

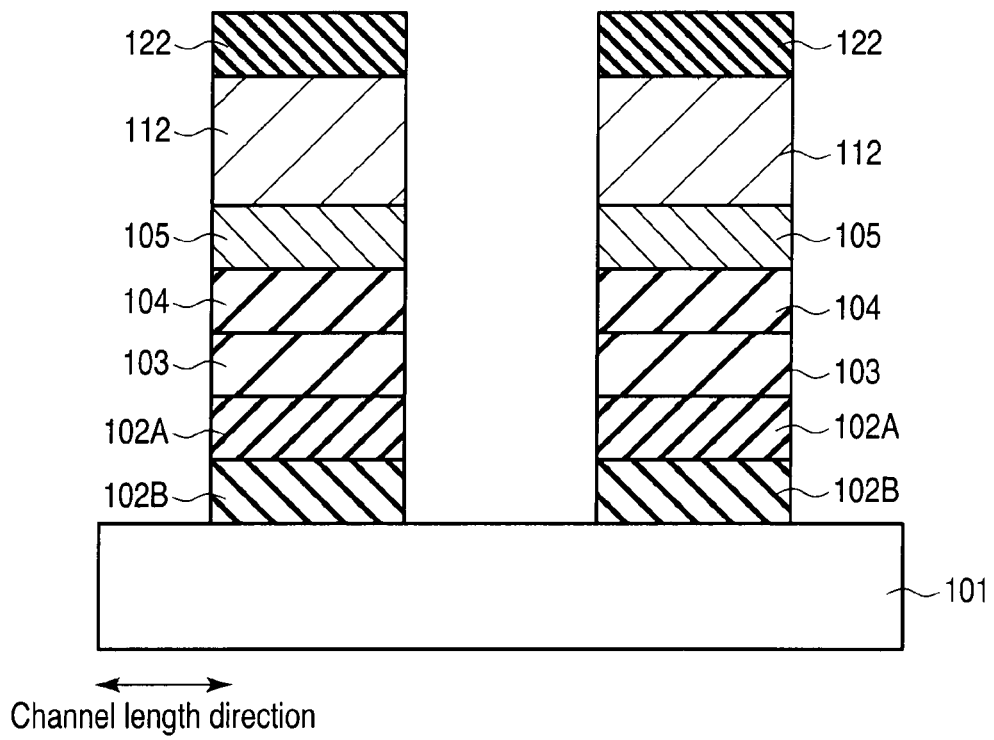
F I G. 39
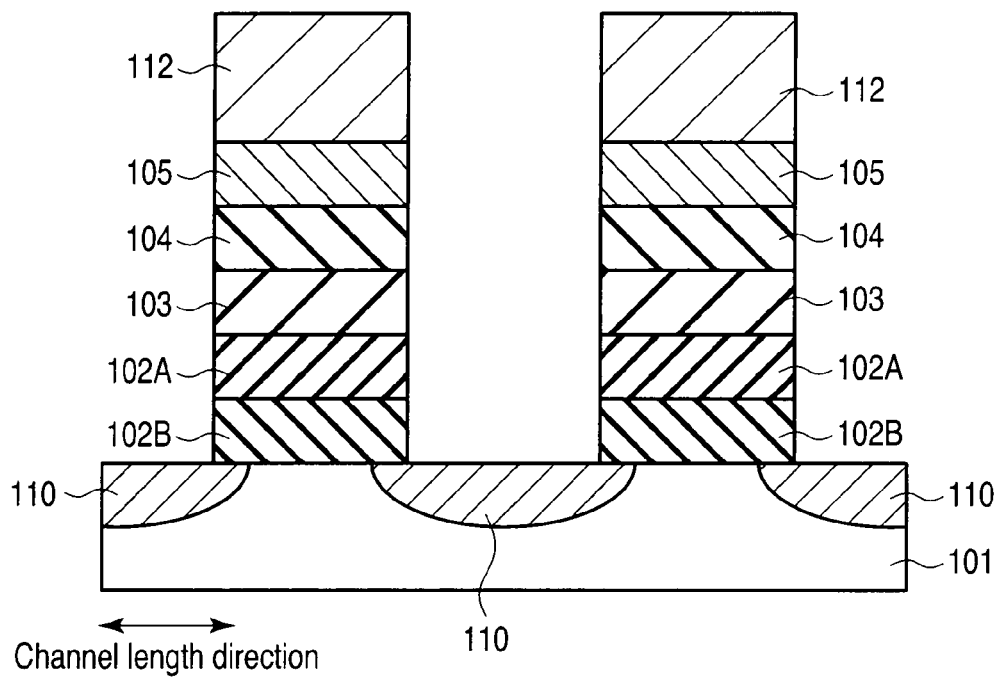
F I G. 40

NONVOLATILE SEMICONDUCTOR MEMORY DEVICE

CROSS-REFERENCE TO RELATED APPLICATIONS

This application is based upon and claims the benefit of priority from prior Japanese Patent Application No. 2008-246690, filed Sep. 25, 2008, the entire contents of which are incorporated herein by reference.

BACKGROUND OF THE INVENTION

1. Field of the Invention

The present invention relates to a nonvolatile semiconductor memory device which stores information in accordance with a charge amount in a charge storage layer.

2. Description of the Related Art

A NAND type flash memory in which data is electrically written and erased is known as a nonvolatile semiconductor memory device. Memory cells constituting the NAND type flash memory have a stacked gate structure. In this stacked gate structure, a first insulating film, a charge storage layer, a second insulating film and a control gate electrode are stacked in order on a silicon (Si) substrate. The first insulating film is called a "tunnel insulating film". The second insulating film is called an "intergate insulating film" in the case where the charge storage layer is a floating gate electrode made of, for example, polysilicon, or the second insulating film is called a "block insulating film" in the case where the charge storage layer is made of an insulator.

Silicon oxide or silicon oxynitride has heretofore been used for the first and second insulating films. However, due to the miniaturization of the memory cells, the use of an insulating film with a higher dielectric constant (high-k film) is considered (e.g., JP-A 2003-68897 (KOKAI)). The reason for this is that a high-k film permits an increased electric thickness while maintaining an actual thickness (physical thickness).

However, defects tend to be formed in the high-k film as compared with the silicon oxide film and the silicon oxynitride film. Therefore, in the memory cell using the high-k films for the first or second insulating film, a leakage current in a high field region containing an FN tunnel current as the main component can be reduced in writing and erasure, whereas data retention characteristics deteriorate due to a leakage current in a low field region. Moreover, a high-k film of, for example, alumina or hafnia is apt to be crystallized due to a heat treatment provided in a process of manufacturing a memory cell. If the high-k film is miniaturized together with the miniaturization of the memory cell, the amount of a leakage current in the low field region more noticeably varies according to the size of a crystal grain and the number of crystal grain boundaries, resulting in decreased reliability of the memory cell. Thus, the disadvantage of the use of a crystallized high-k material is that the leakage current characteristics in both the high field region and the low field region cannot be improved at the same time.

BRIEF SUMMARY OF THE INVENTION

According to an aspect of the present invention, there is provided a nonvolatile semiconductor memory device comprising: a source region and a drain region provided apart from each other in a semiconductor substrate; a first insulating film provided on a channel region between the source region and the drain region; a charge storage layer provided on the first insulating film; a second insulating film provided on the charge storage layer and including a stacked structure of a first lanthanum aluminum silicate film and a first dielectric film made of silicon oxide or silicon oxynitride; and a control gate electrode provided on the second insulating film.

According to an aspect of the present invention, there is provided a nonvolatile semiconductor memory device comprising: a source region and a drain region provided apart from each other in a semiconductor substrate; a first insulating film provided on a channel region between the source region and the drain region; a charge storage layer provided on the first insulating film; a second insulating film provided on the charge storage layer and including a stacked structure of a first dielectric film made of silicon oxynitride or silicon nitride, a first silicon oxide film, a lanthanum aluminum silicate film, a second silicon oxide film and a second dielectric film made of silicon oxynitride or silicon nitride; and a control gate electrode provided on the second insulating film.

According to an aspect of the present invention, there is provided a nonvolatile semiconductor memory device comprising: a source region and a drain region provided apart from each other in a semiconductor substrate; a first insulating film provided on a channel region between the source region and the drain region and including a stacked structure of a first lanthanum aluminum silicate film and a first dielectric film made of silicon oxide or silicon oxynitride; a charge storage layer provided on the first insulating film; a second insulating film provided on the charge storage layer; and a control gate electrode provided on the second insulating film.

BRIEF DESCRIPTION OF THE SEVERAL VIEWS OF THE DRAWING

FIG. 1 is a sectional view in a channel length direction showing the configuration of a nonvolatile semiconductor memory device according to a first embodiment;

FIG. 2 is a sectional view in a channel width direction showing the configuration of the nonvolatile semiconductor memory device according to the first embodiment;

FIG. 5 is a sectional view in a channel width direction showing the configuration of the nonvolatile semiconductor memory device according to the comparative example;

FIG. 6 is a sectional view showing a method of manufacturing the nonvolatile semiconductor memory device according to the first embodiment;

FIGS. 7 to 21 are sectional views showing the method of manufacturing the nonvolatile semiconductor memory device;

FIGS. 24A to 24D are schematic diagrams showing an extracted tunnel insulating film 102 according to the second embodiment;

FIG. 25 is a sectional view showing a method of manufacturing the nonvolatile semiconductor memory device according to the second embodiment; and FIGS. 26 to 40 are sectional views showing the method of manufacturing the nonvolatile semiconductor memory device.

DETAILED DESCRIPTION OF THE INVENTION

Figure 3A:
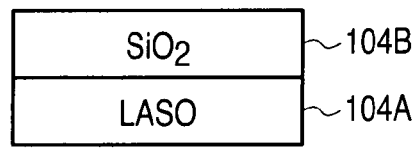
FIGS. 3A to 3E are schematic diagrams showing an extracted block insulating film 104 according to the first embodiment.

Hereinafter, embodiments of the present invention will be described with reference to the drawings. It is to be noted that like signs are assigned to elements having like functions and configurations in the following description and that repeated explanations are given only when necessary.

[First Embodiment]

<1. Configuration Of Nonvalatile Semiconductor Memory Device>

A first embodiment of the present invention is described below in detail with the drawings. FIGS. 1 and 2 are sectional views showing the configuration of a nonvolatile semiconductor memory device according to the first embodiment. FIG. 1 is a sectional view in a channel length direction and FIG. 2 is a sectional view in a channel width direction. The channel length direction means a column direction in which a bit line extends, and the channel width direction means a row direction in which a word line (control gate electrode) extends.

A memory cell shown in FIGS. 1 and 2 is a metal-oxide-nitride-oxide-semiconductor (MONOS) type memory cell in which a charge storage layer is made of an insulator. Although this embodiment describes the MONOS type memory cell, it is also possible to apply a floating gate type memory cell in which a charge storage layer is made of a conductor such as polysilicon.

A source region 110S and a drain region 110D are provided apart from each other in a surface region of a silicon substrate (including a well) 101 doped with a p-type impurity. The source region 110S and the drain region 110D are formed by doping the silicon substrate 101 with an n-type impurity. A channel region is located between the source region 110S and the drain region 110D. When the memory cell is turned on, a channel for electrically conducting the source region 110S and the drain region 110D is formed in the channel region. The source region 110S and the drain region 110D are formed by the ion implantation of an impurity into the silicon substrate 101 in a self-aligning manner using, as a mask, a stacked gate structure provided on the channel region.

On the channel region between the source region 110S and the drain region 110D, a silicon oxide film ($SiO_2$) 102 having a thickness of about 4 nm, for example, is provided as a tunnel insulating film (first insulating film) 102. A silicon nitride film ($Si_3N_4$) 103 having a thickness of, for example, about 6 nm is provided on the first insulating film 102 as a charge storage layer 103.

A block insulating film (second insulating film) 104 is provided on the charge storage layer 103. FIGS. 3A to 3E are schematic diagrams showing the extracted block insulating film 104. A first example (FIG. 3A) of the block insulating film 104 comprises a stacked insulating film (LO structure) composed of an amorphous lanthanum aluminum silicate film (LASO) 104A having a thickness of about 6 nm and a silicon oxide film ($SiO_2$) 104B having a thickness of about 3 nm. A second example (FIG. 3B) of the block insulating film 104 comprises a stacked insulating film (OL structure) composed of a silicon oxide film ($SiO_2$) 104B having a thickness of about 3 nm and a lanthanum aluminum silicate film (LASO) 104A having a thickness of about 6 nm. A third example (FIG. 3C) of the block insulating film 104 comprises a stacked insulating film (OLO structure) composed of a silicon oxide film ($SiO_2$) 104B having a thickness of about 1.5 nm, a lanthanum aluminum silicate film (LASO) 104A having a thickness of about 6 nm, and a silicon oxide film ($SiO_2$) 104C having a thickness of about 1.5 nm.

A fourth example (FIG. 3D) of the block insulating film 104 comprises a stacked insulating film (LOL structure) composed of a lanthanum aluminum silicate film (LASO) 104A having a thickness of about 3 nm, a silicon oxide film ($SiO_2$) 104B having a thickness of about 3 nm, and a lanthanum aluminum silicate film (LASO) 104D having a thickness of about 3 nm. A fifth example (FIG. 3E) of the block insulating film 104 comprises a stacked insulating film (NOLON structure) composed of a silicon oxynitride film (SiON) 104E having a thickness of about 1.5 nm, a silicon oxide film ($SiO_2$) 104B having a thickness of about 1.5 nm, a lanthanum aluminum silicate film (LASO) 104A having a thickness of about 4 nm, a silicon oxide film ($SiO_2$) 104C having a thickness of about 1.5 nm, and a silicon oxynitride film (SiON) 104F having a thickness of about 1.5 nm. The silicon oxynitride films 104E and 104F may be silicon nitride films (SiN).

A silicon oxynitride film (SiON) may be used instead of the silicon oxide film ($SiO_2$) included in the LO structure, the OL structure, the OLO structure and the LOL structure.

The composition ratio among lanthanum, aluminum and silicon constituting the lanthanum aluminum silicate film is described here. While lanthanum as a metal has hygroscopicity and reactivity of, for example, absorbing carbon dioxide, lanthanum represses the hygroscopicity and reactivity when bonded to aluminum and oxygen. Thus, the composition ratio of lanthanum contained in the lanthanum aluminum silicate film is desirably equal to or less than that of aluminum. Moreover, lanthanum has the property of being hard to diffuse around when reacted with silicon, so that the composition ratio of lanthanum is desirably equal to or less than that of aluminum. However, increased composition ratios of aluminum and silicon reduce a dielectric constant, and the most desirable composition ratio is therefore Al:La:Si=1:1:1.

On the block insulating film 104, a control gate electrode 105 about 100 nm thick which is made of polysilicon doped with, for example, an n-type impurity is provided. On the control gate electrode 105, a low-resistance metal layer 112 about 100 nm thick which is made of, for example, tungsten (W) is provided. A plurality of stacked gate structures composed of the tunnel insulating film 102, the charge storage layer 103, the block insulating film 104 and the control gate electrode 105 are arranged in a row direction. These structures are isolated from each other by element isolation insulating layers 111. The element isolation insulating layer 111 comprises, for example, a shallow trench isolation (STI). The element isolation insulating layer 111 fills a slit trench about 100 nm deep ranging from the upper surface of the control gate electrode 105 to the silicon substrate 101. The low-resistance metal layer 112 extends in the row direction and functions as a word line.

Here, the thickness of the tunnel insulating film 102 used in the present embodiment is desirably about 2 to 8 nm. Moreover, although the silicon oxide film is used as the tunnel insulating film 102 in the present embodiment, a silicon oxynitride film may be used instead. The use of the silicon oxynitride film for the tunnel insulating film 102 reduces a potential barrier to a hole, which provides an advantage of accelerated erasing operation of the memory cell. A stacked tunnel insulating film composed of, for example, a silicon oxide film/a silicon nitride film/a silicon oxide film (ONO film) may also be used as the tunnel insulating film 102. This provides an advantage of accelerated writing and erasing operations. In addition, the right side of "/" indicates a lower layer, and the left side indicates au upper layer.

The thickness of the silicon nitride film as the charge storage layer 103 used in the present embodiment is desirably about 3 to 10 nm. Moreover, the silicon nitride film as the charge storage layer 103 does not necessarily have to be $Si_3N_4$ having a stoichiometric composition, and may have an Si-rich composition for increased trap density or may have a nitrogen-rich composition for a deeper trap level. Moreover, the silicon nitride film as the charge storage layer 103 does not necessarily have to be a film having a uniform composition, and may be a stacked film or a continuous film in which the ratio between silicon and nitrogen varies in the thickness direction.

Furthermore, as the charge storage layer 103, a silicon oxynitride film containing a certain amount of oxygen may be used instead of the silicon nitride film. Moreover, as the charge storage layer 103, it is possible to use a high-dielectric-constant charge storage layer containing hafnium (Hf) and zirconium (Zr), such as $HfO_2$, HfON, $HfSiO_x$, HfSiON, $HfAlO_x$, HfAlON, $ZrO_2$, ZrON, $ZrSiO_x$, ZrSiON, $ZrAlO_x$ or ZrAlON. It is also possible to use a high-dielectric-constant charge storage layer to which lanthanum (La) is added, such as an La-added $HfSiO_x$ or hafnium lanthanum oxide ($HfLaO_x$). The charge storage layer 103 may also be a stacked film or continuous film composed of a silicon nitride film and the high-dielectric-constant charge storage layer.

Still further, the memory cell is not limited to the MONOS type memory cell in which the charge storage layer 103 is made of an insulator, and the memory cell may be a floating gate type memory cell in which the charge storage layer 103 is made of a conductor such as polysilicon. In the case of the floating gate type memory cell, the block insulating film 104 is called an "intergate insulating film". As the charge storage layer (floating gate electrode) 103 used in the floating gate type memory cell, it is possible to use the same material as the metal conductive material of the control gate electrode 105, described later, as well as n-type polysilicon doped with phosphorus (P) or arsenic (As) or p-type polysilicon doped with boron (B).

For the control gate electrode 105, p-type polysilicon doped with boron (B) may be used instead of n-type polysilicon doped with phosphorus (P) or arsenic (As). Moreover, the following metal conductive materials (1) to (7) can be used for the control gate electrode 105:

(1) A material containing one or more elements selected from the group consisting of platinum (Pt), tungsten (W), iridium (Ir), ruthenium (Ru), rhenium (Re), molybdenum (Mo), titanium (Ti), tantalum (Ta), nickel (Ni) and cobalt (Co)

(2) Silicide of a material containing one or more elements selected from the group consisting of platinum (Pt), tungsten (W), titanium (Ti), tantalum (Ta), nickel (Ni) and cobalt (Co)

(3) Carbide of a material containing one or more elements selected from the group consisting of tungsten (W), titanium (Ti) and tantalum (Ta)

(4) Nitride of a material containing one or more elements selected from the group consisting of tungsten (W), molybdenum (Mo), titanium (Ti) and tantalum (Ta)

(5) Silicon nitride of a material containing titanium (Ti)

(6) Oxide of a material containing one or more elements selected from the group consisting of iridium (Ir) and ruthenium (Ru)

(7) A compound or mixture of materials (1) to (6).

<2. FUNCTION OF SECOND INSULATING FILM (BLOCK INSULATING FILM) 104>

The following advantage is provided when the second insulating film 104 is structured by a stack of a lanthanum aluminum silicate film and a silicon oxide film or silicon oxynitride.

As in FIG. 3A, when the silicon oxide film or the silicon oxynitride film is inserted onto the side of the control gate electrode, electron injection from the control gate electrode in erasure is suppressed, and erasing efficiency is thus improved.

Figure 3D:
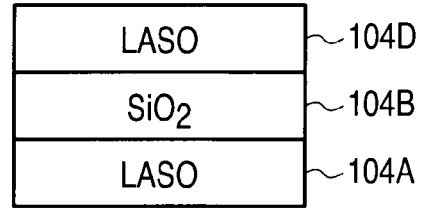
Figure 3B:
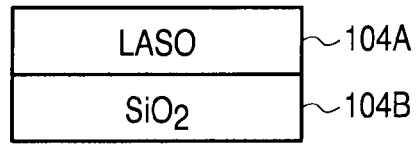

As in FIG. 3B, when the silicon oxide film or the silicon oxynitride film is inserted onto the side of the charge storage layer (or the floating gate electrode), electrons in writing or holes in erasure tend to be trapped due to the size of a band gap. That is, writing efficiency and erasing efficiency are improved.

Figure 3C:
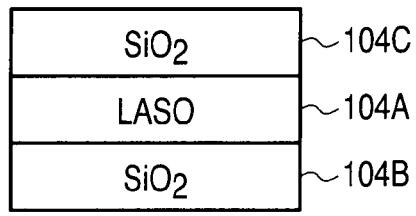

As in FIG. 3C, when the silicon oxide films or the silicon oxynitride films are inserted onto both the side of the control gate electrode and the side of the charge storage layer (or the floating gate electrode), both of the above-mentioned advantages can be obtained. That is, writing efficiency and erasing efficiency are more improved. Moreover, when polysilicon electrodes are used as the control gate electrode and the floating gate electrode, the insertion of the silicon oxide film or the silicon oxynitride film onto the side of the control gate electrode and the side of the floating gate electrode has the advantage of inhibiting interfacial defects of the electrode, and a polarization component with slow dielectric response attributed to the interfacial defects can be inhibited.

In FIG. 3D, the relative dielectric constant of LASO is high, so that with regard to an equivalent oxide thickness field (EOT field), the leakage current of the block insulating film itself is inhibited by an actual electric field, and at the same time, charge retention characteristics can be improved by the insertion of the silicon oxide film.

Figure 3E:
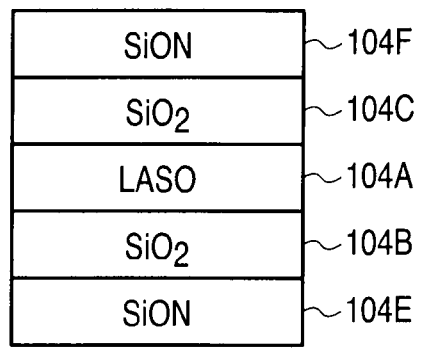

In FIG. 3E, when a high-temperature process is needed, it is possible to completely inhibit the diffusion of a small amount of lanthanum and aluminum toward the control gate electrode and the charge storage layer (or the floating gate electrode).

The dielectric constant of the whole block insulating film decreases if the thickness of the silicon oxide film is too great. Therefore, the thickness of the silicon oxide film is desirably smaller than at least that of the tunnel insulating film. However, an extremely small thickness results in a significant affect of a direct tunnel current. It is therefore desirable to be able to inhibit the direct tunnel current, so that the thickness of the silicon oxide film is more desirably about 2 to 5 nm.

The second insulating film 104 in the present embodiment is capable of inhibiting the leakage current both in a high field region and a low field region. The second insulating film 104 includes the lanthanum aluminum silicate film and the silicon oxide film (or the silicon oxynitride film). Lanthanum aluminum silicate has a dielectric constant of about 13 to 14, and is a high-dielectric-constant insulating film.

The leakage current in the high field region is dominated by a tunnel current, which is determined by the entrance at which a charge is injected into the second insulating film 104, that is, by the material of the insulating film in the vicinity of a cathode end. Thus, the use of the high-dielectric-constant insulating film in the vicinity of the cathode end is more advantageous to the inhibition of the high field leakage current.

On the other hand, in order to inhibit the leakage current of the second insulating film 104 in the low field region, it is desirable to insert, into the second insulating film 104, the silicon oxide film having a low density of defects acting as paths for electric conduction.

That is, the reduction of the defects in the film is most important in inhibiting the low field leakage current, and the increase of the dielectric constant of the film is most important in inhibiting the high field leakage current. The reason for this is that the leakage current resulting from the defects in the film has a gentle field dependency and is predominant in the low field region while an intrinsic leakage current determined by the dielectric constant of the film and a barrier height has a sharp field dependency and is predominant in the high field region.

Furthermore, the silicon oxide film has a higher potential barrier (barrier height) than the high-dielectric-constant insulating film. The "barrier height" (or "band offset") means the energy position at the end of the conduction band of each layer which is measured on the basis of the energy position at the end of the conduction band of the silicon substrate in a situation where there is no external field application and where an energy band is flat.

The barrier height of the silicon oxide film functions as a tunnel barrier of electrons in the high field region. Thus, the use of the silicon oxide film for part of the second insulating film 104 provides the advantage of not only decreasing the low field leakage current but also decreasing the high field leakage current. This advantage is not obtained by the second insulating film having a single high-dielectric-constant insulating film but is obtained by the use of a low-dielectric-constant silicon oxide film having a low defect density for part of the second insulating film 104.

Lanthanum aluminum silicate has the advantage of inhibiting the leakage current in the high field region with an Eox (equivalent oxide thickness field) of 10 MV/cm or more. Moreover, lanthanum aluminum silicate is capable of maintaining the amorphous state even when subjected to a high-temperature heat treatment (e.g., 1000° C.). In the process of manufacturing a memory cell, a high-temperature heat treatment at 900 to 1000° C. is given in the step of forming the source/drain regions, in order to activate the impurity injected into the silicon substrate. However, if lanthanum aluminum silicate is used for part of the second insulating film 104, lanthanum aluminum silicate can maintain the amorphous state even when the memory cell is subjected to the high-temperature heat treatment, and thus the second insulating film 104 with a low leakage current can be obtained.

The use of lanthanum aluminum silicate which is a high-dielectric-constant insulating film also makes it possible to reduce the equivalent oxide thickness (EOT) of the second insulating film 104. This allows a reduction in the operating voltage (write voltage, erasing voltage) of the memory cell.

Furthermore, lanthanum aluminum silicate does not easily mix with silicon, silicon oxide, silicon nitride or silicon oxynitride. Therefore, even when a sidewall made of silicon oxide, silicon nitride or silicon oxynitride is formed on the side surface of a stacked gate structure, deterioration of the characteristics of lanthanum aluminum silicate can be prevented. Lanthanum aluminum silicate having such characteristics can be suitably used for a memory cell.

On the other hand, polysilicon is used as a charge storage layer in the floating gate type memory cell, and the second insulating film 104 is disposed in contact with polysilicon. However, lanthanum aluminum silicate has the property of not easily mixing with silicon, silicon oxide, silicon nitride or silicon oxynitride. Thus, if the lanthanum aluminum silicate film included in the second insulating film 104 is disposed on the side to contact polysilicon as in the LO structure or the LOL structure, mutual diffusion can be prevented, and deterioration of the characteristics of the second insulating film 104 can be inhibited.

The high field operation of the memory cell is performed both in writing and erasing, and voltages are applied to the second insulating film 104 in opposite directions in the respective operations. An uppermost layer and a lowermost layer in the second insulating film 104 mainly function to reduce the leakage current in the high field region, so that a high dielectric constant takes top priority, and a relatively high in-film defect density is permitted to some degree. On the other hand, the interlayer between the uppermost layer and the lowermost layer is mainly intended to block the low field leakage current, so that a high in-film defect density takes top priority. Thus, it is desirable that high-dielectric-constant lanthanum aluminum silicate films be disposed for the uppermost layer and the lowermost layer of the second insulating film 104 and that a silicon oxide film with few defects be disposed for the interlayer. From this point of view, the LOL structure shown in FIG. 3D is optimum.

<3. Comparative Example>

Figure 4:
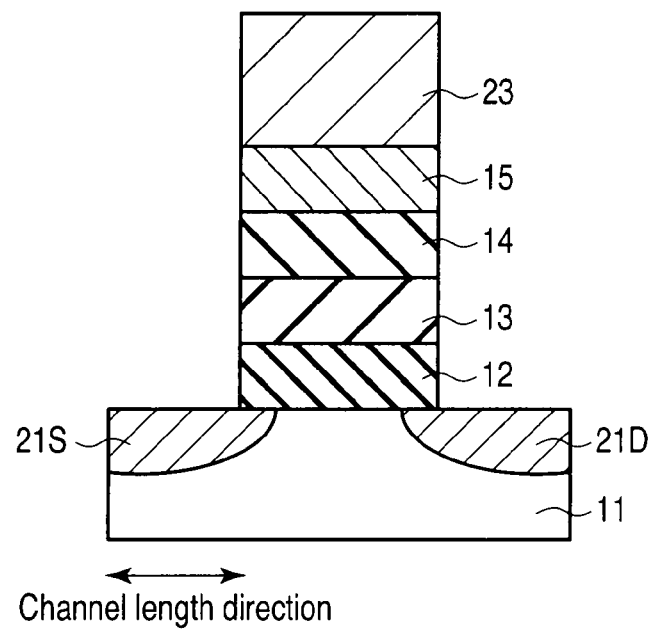
FIG. 4 is a sectional view in a channel length direction showing the configuration of a nonvolatile semiconductor memory device according to a comparative example.

FIGS. 4 and 5 are sectional views showing the configuration of a nonvolatile semiconductor memory device according to a comparative example. FIG. 4 is a sectional view in a channel length direction and FIG. 5 is a sectional view in a channel width direction.

As shown in FIG. 4, a source region 21S and a drain region 21D are provided apart from each other in a surface region of a silicon substrate (including a well) 11 doped with a p-type impurity. On the channel region between the source region 21S and the drain region 21D, a tunnel insulating film (first insulating film) 12 made of silicon oxide having a thickness of about 3 to 4 nm is provided.

A charge storage layer 13 made of silicon nitride having a thickness of about 6 nm is provided on the tunnel insulating film 12. A block insulating film (second insulating film) 14 made of aluminum oxide (alumina) having a thickness of about 15 nm is provided on the charge storage layer 13. On the block insulating film 14, a control gate electrode 15 about 100 nm thick which is made of polysilicon doped with, for example, an n-type impurity is provided.

As shown in FIG. 5, a plurality of stacked gate structures composed of the tunnel insulating film 12, the charge storage layer 13, the block insulating film 14 and the control gate electrode 15 are arranged in a row direction. These structures are isolated from each other by, for example, element isolation insulating layers 22 made of, for example, STI. Further, a word line 23 extending in the row direction is provided on the control gate electrode 15 and the element isolation insulating layer 22. The word line 23 is made of, for example, a low-resistance metal layer of tungsten (W) having a thickness of about 100 nm.

In the memory cell in this comparative example, the block insulating film (second insulating film) is made of alumina as one kind of high-k film, thus the leakage current in the low field region resulting from the defects in the film in particular is not negligible, and the data retention characteristics of the memory cell deteriorates, which makes it impossible to ensure long-term reliability of a NAND type flash memory.

<4. Method Of Manufacturing Nonvolatile Semiconductor Memory Device>

A method of manufacturing the nonvolatile semiconductor memory device according to the present embodiment is described. Of the drawings used for the explanation of the manufacturing method, FIGS. 6 to 17 are sectional views in the channel width direction (row direction), and FIGS. 18 to 21 are sectional views in the channel length direction (column direction).

First, as shown in FIG. 6, the upper surface of a silicon substrate (including a well) 101 doped with a p-type impurity is washed, and then a silicon oxide film (tunnel insulating film) 102 having a thickness of about 4 nm is formed by a thermal oxidation method in a temperature range of 800 to 1000° C. Then, as shown in FIG. 7, a silicon nitride film (charge storage layer) 103 having a thickness of about 6 nm is formed on the tunnel insulating film 102 by a low pressure chemical vapor deposition (LPCVD) method using dichlorosilane ($SiH_2Cl_2$) and ammonia ($NH_3$) as source gases in a temperature range of 600 to 800° C.

Then, as shown in FIG. 8, a lanthanum aluminum silicate film 104A is formed by a sputtering method in a temperature range of 200 to 700° C., and a heat treatment at 900 to 1050° C. is carried out to reform the lanthanum aluminum silicate film 104A. Then, a silicon oxide film 104B having a thickness of about 3 nm is formed by the LPCVD method using dichlorosilane ($SiH_2Cl_2$) and nitrous oxide ($N_2O$) as source gases in a temperature range of 600 to 800° C. Thus, a stacked insulating film (LO structure) composed of the silicon oxide film/ the lanthanum aluminum silicate film serving as the block insulating film (second insulating film) 104 can be formed.

In addition, although the LO structure is shown in FIG. 8, the OL structure of a lanthanum aluminum silicate film/a silicon oxide film, the OLO structure of a silicon oxide film/a lanthanum aluminum silicate film/a silicon oxide film, or the LOL structure of a lanthanum aluminum silicate film/a silicon oxide film/a lanthanum aluminum silicate film can be formed by applying the film formation method for the LO structure and changing the order of forming films and the number of forming films. For the NOLON structure of a silicon oxynitride film/a silicon oxide film/a lanthanum aluminum silicate film/a silicon oxide film/a silicon oxynitride film, a silicon nitride film, for example, can be formed by the LPCVD method and oxidized to form a silicon oxynitride film. When a silicon oxynitride film is used instead of a silicon oxide film in the LO structure and the like, a film formation method similar to the one described above can be used.

Then, as shown in FIG. 9, a polysilicon film (amorphous silicon film in the case of a low formation temperature) 105 as a control gate electrode 105 doped with an n-type impurity is formed on the block insulating film 104 by the LPCVD method using silane ($SiH_4$) and phosphine ($Ph_3$) as source gases in a temperature range of 550 to 700° C.

Then, as shown in FIG. 10, a mask layer 120 for fabricating an element isolation region is formed on the polysilicon film 105. An insulator, for example, is used as the mask layer 120. Then, a photoresist (not shown) is formed on the mask layer 120, and this photoresist is exposed and developed. Then, as shown in FIG. 11, a pattern in the photoresist is transferred to the mask layer 120 by, for example, a reactive ion etching (RIE) method. Then, the photoresist is removed.

Figure 12:
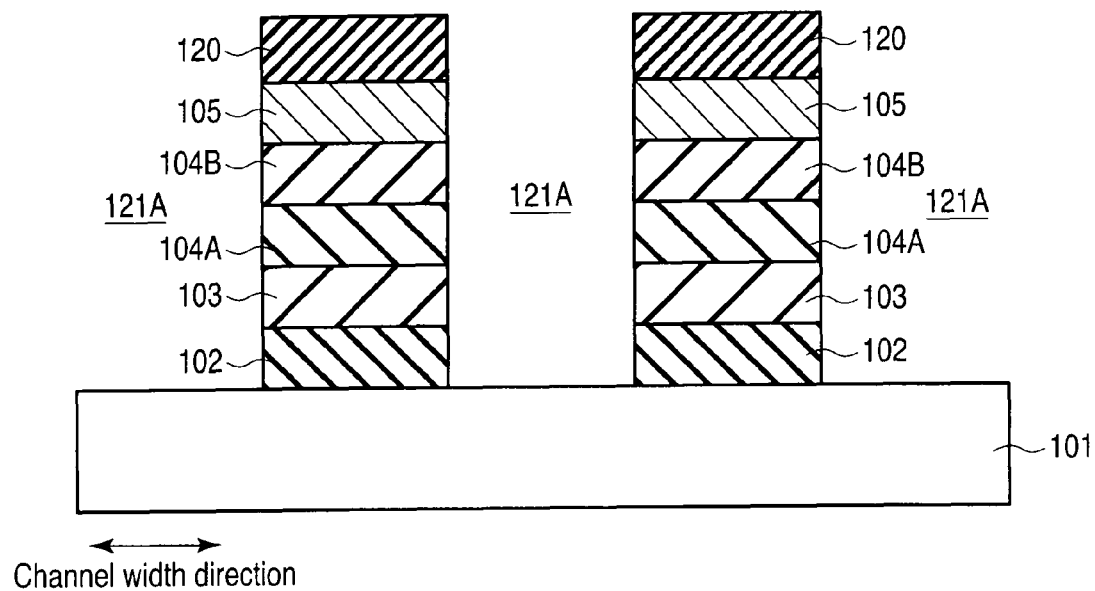
Figure 13:
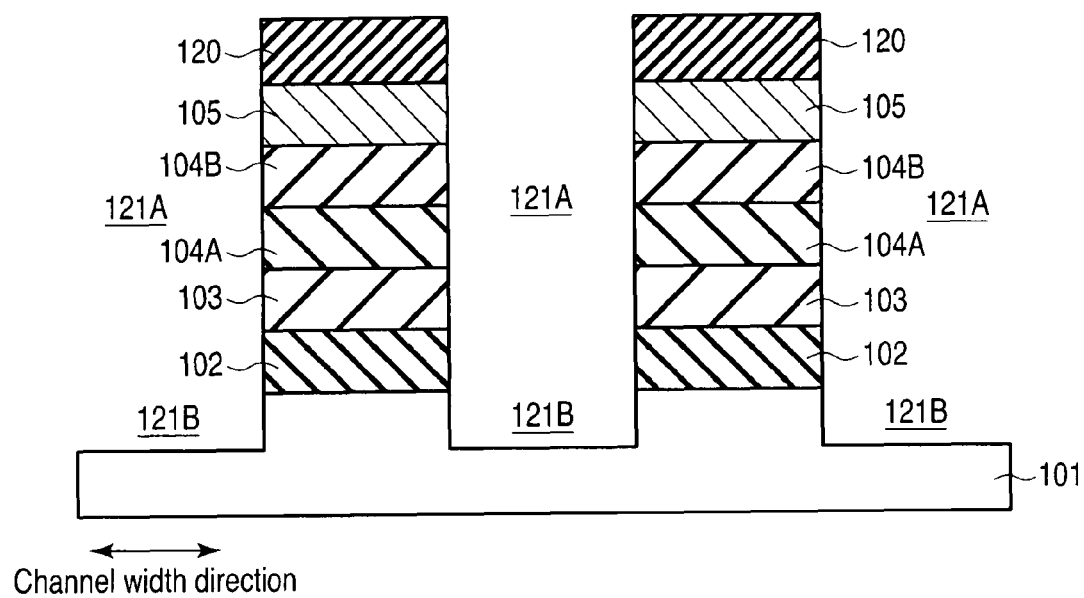

Then, as shown in FIG. 12, the control gate electrode 105, the block insulating film 104 (104A, 104B), the charge storage layer 103 and the tunnel insulating film 102 are sequentially etched by the RIE method using the mask layer 120 as a mask, thereby forming a plurality of slits 121A which separate memory cells adjacent in the row direction from each other. Further, as shown in FIG. 13, the silicon substrate 101 is etched by the RIE method, and a plurality of element isolation trenches 121B about 100 nm deep are formed in the silicon substrate 101.

Figure 14:
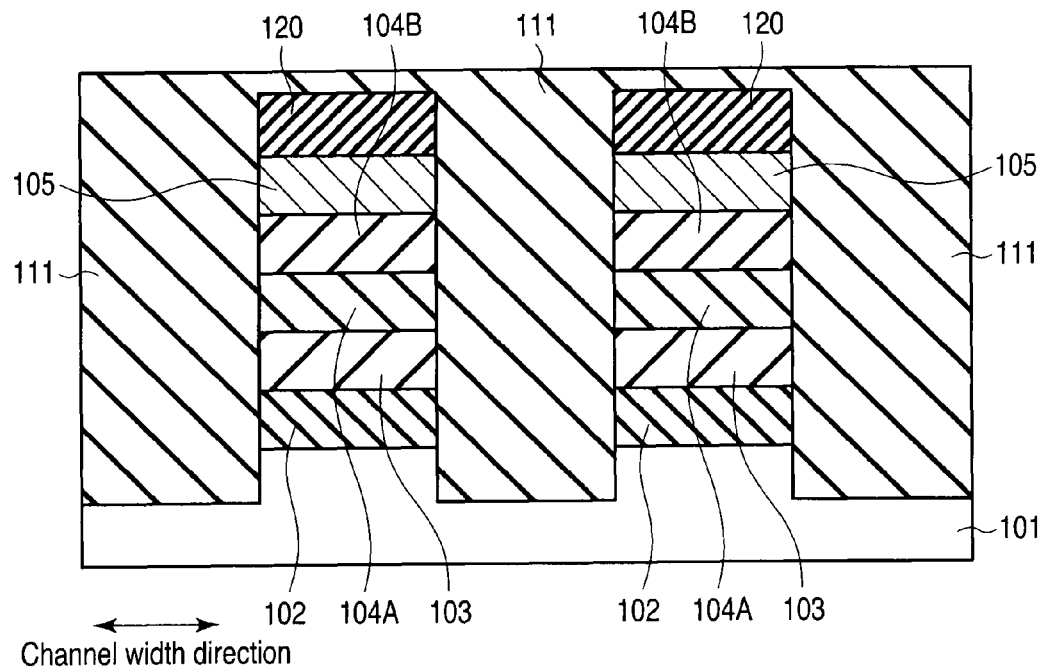
Figure 15:
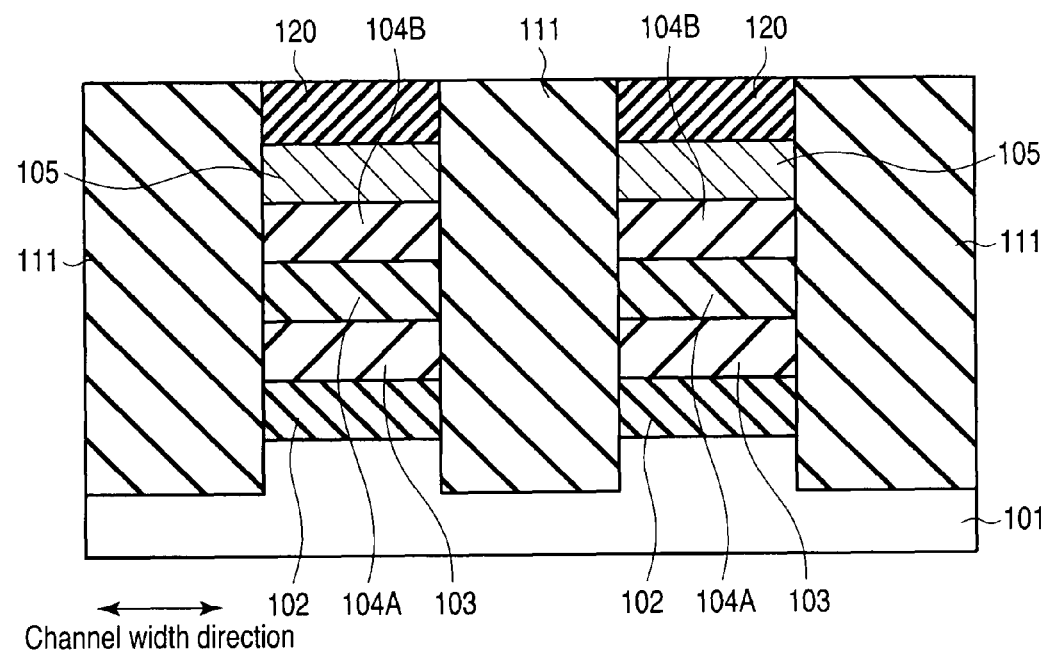
Figure 16:
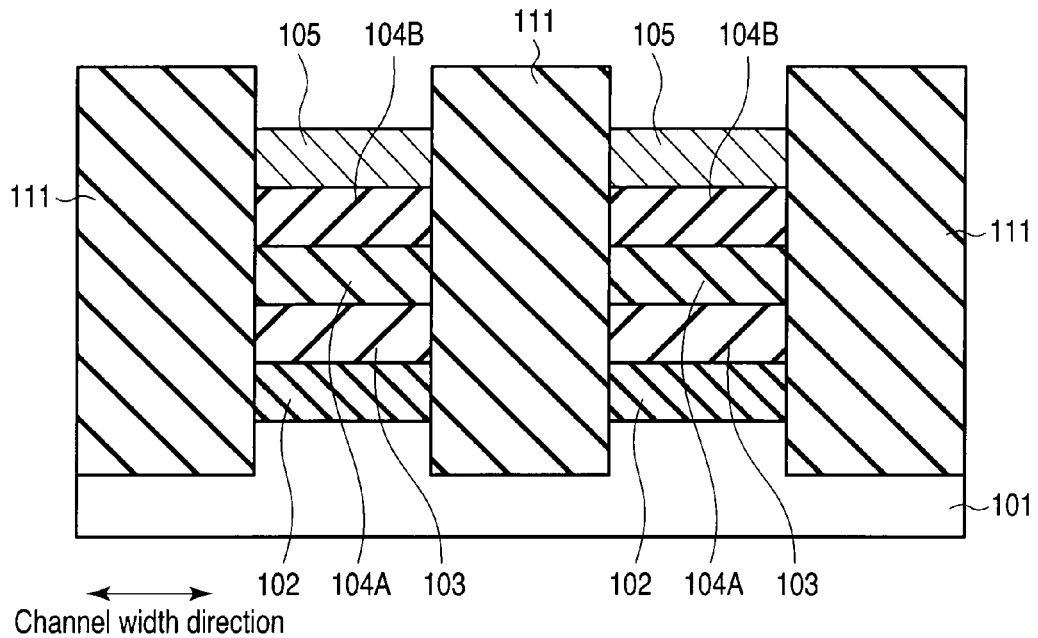

Then, as shown in FIG. 14, a silicon oxide film (buried oxide film) 111 completely filling the slits 121A and the element isolation trenches 121B is formed by, for example, a CVD method. Then, as shown in FIG. 15, the silicon oxide film 111 is polished by a chemical mechanical polishing (CMP) method until the mask layer 120 is exposed, so that the upper surface of the silicon oxide film 111 is planarized. Then, as shown in FIG. 16, the mask layer 120 is removed.

Figure 17:
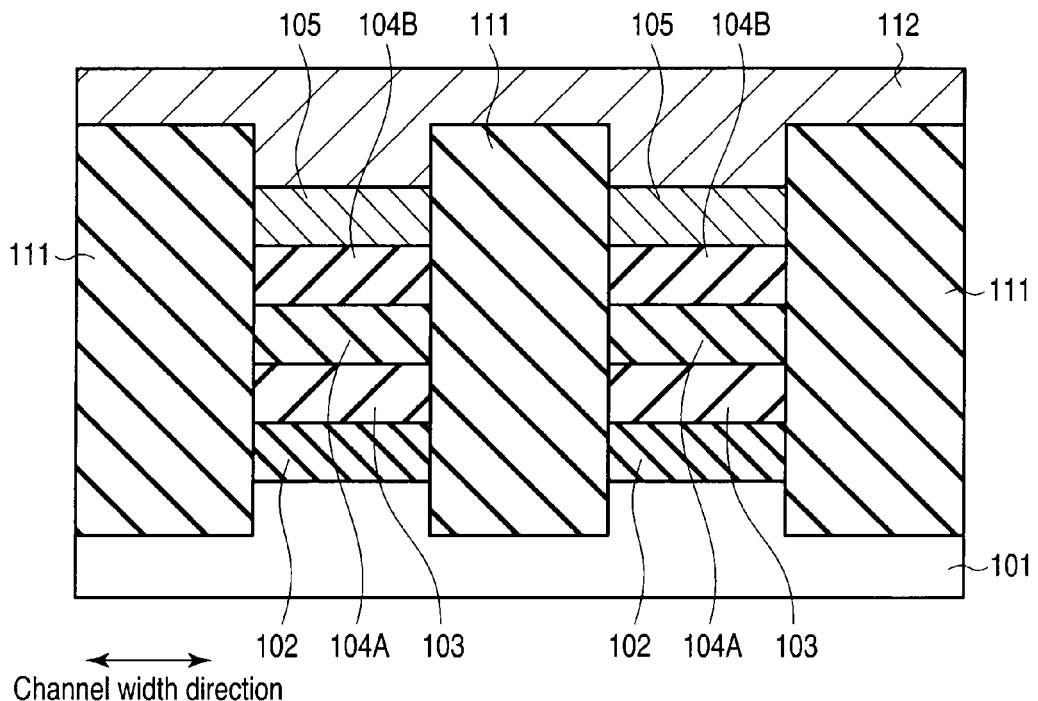

Then, as shown in FIG. 17, a low-resistance metal layer (word line) 112 of, for example, tungsten (W) having a thickness of about 100 nm is formed on the control gate electrode 105 by the CVD method using $WF_6$ or $W(CO)_6$ as a source gas in a temperature range of 400 to 600° C.

Figure 18:
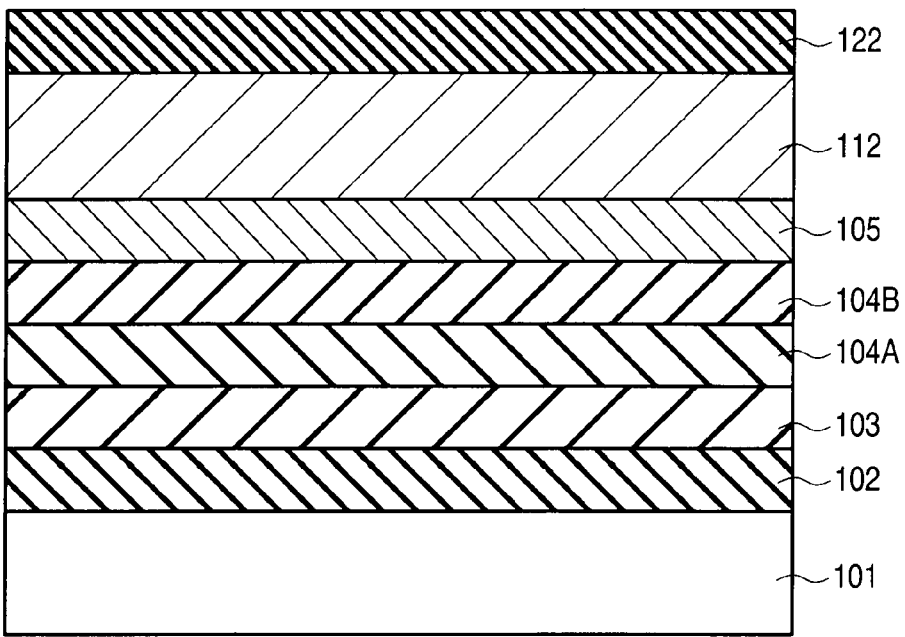
Figure 19:
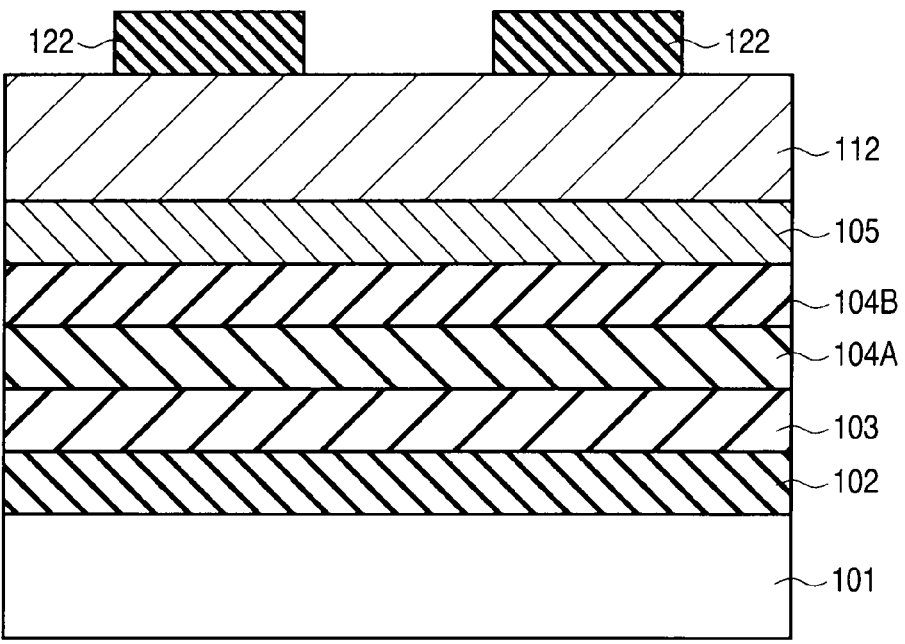

Then, as shown in FIG. 18, a mask layer 122 is formed on the low-resistance metal layer 112 by, for example, the CVD method. An insulator, for example, is used as the mask layer 122. A photoresist (not shown) is formed on the mask layer 122, and the photoresist is exposed and developed. Then, as shown in FIG. 19, a pattern in the photoresist is transferred to the mask layer 122 by, for example, the RIE method. Then, the photoresist is removed.

Figure 20:
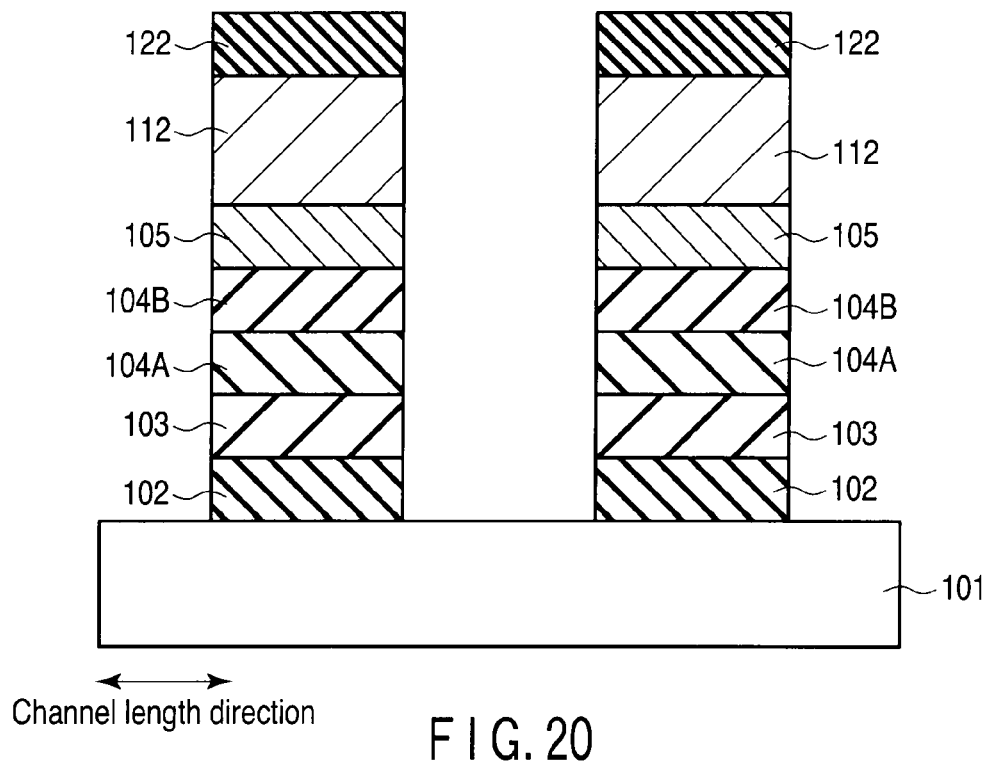

Then, as shown in FIG. 20, the low-resistance metal layer 112, the control gate electrode 105, the block insulating film 104 (104A, 104B), the charge storage layer 103 and the tunnel insulating film 102 are sequentially etched by the RIE method using the mask layer 122 as a mask, thereby forming a MONOS type gate structure.

Figure 21:
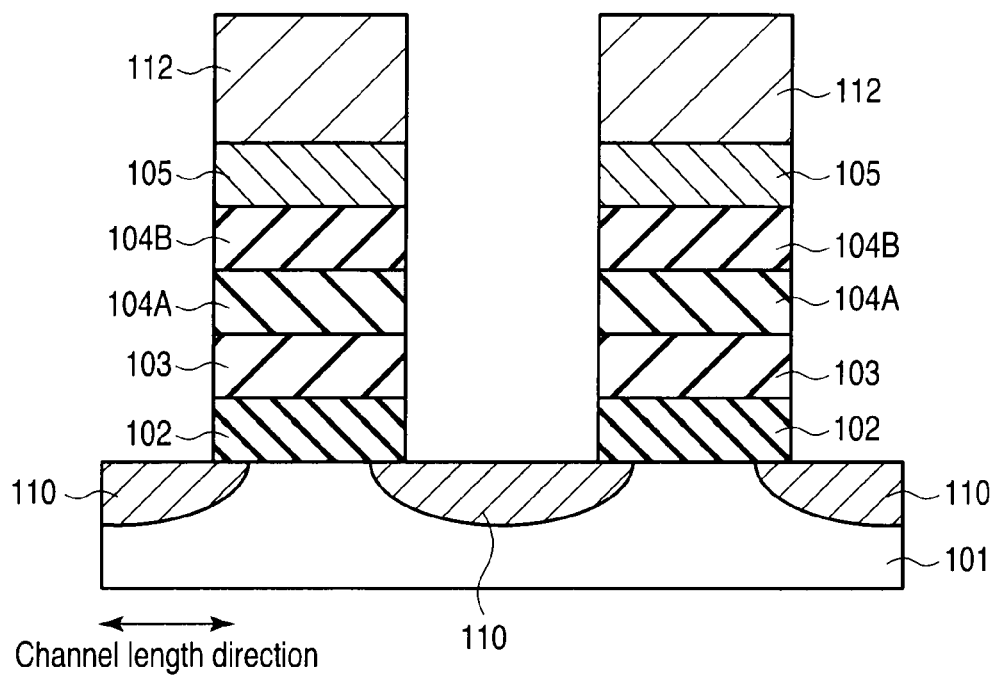

Then, as shown in FIG. 21, the side surface of the MONOS type gate structure is covered with, for example, a silicon oxide film (not shown) by, for example, the CVD method, and then an $n^+$-type diffusion region 110 (including a source region 110S and a drain region 110D) is formed on the surface region of the silicon substrate 101 by an ion implantation method in a self-aligning manner. Thus, memory cells constituting the nonvolatile semiconductor memory device are formed. Finally, an interlayer insulating film (not shown) covering the memory cells is formed by, for example, the CVD method.

The manufacturing method described above is illustrative only, and a nonvolatile semiconductor memory device may be formed by any other manufacturing method. For example, as the thermal oxidation method for the tunnel insulating film 102, it is possible to use not only dry $O_2$ oxidation but also various other methods such as wet oxidation (hydrogen burning oxidation), plasma oxidation using $O_2$ and $H_2O$ as source gases. Moreover, it is possible to introduce, before or after the thermal oxidation, the step of providing an NO gas, an $NH_3$ gas or nitrogen plasma, in order to form a nitrided silicon oxide film (silicon oxynitride film).

Furthermore, the composition of the silicon nitride film used as the charge storage layer 103 can be changed by adjusting the ratio of the flow volumes of dichlorosilane ($SiH_2Cl_2$) and ammonia ($NH_3$), which are the source gases in the LPCVD method. Moreover, the lanthanum aluminum silicate film, which is one layer in the block insulating film 104, may be formed by use of, instead of the sputtering method, any one of a pulsed laser deposition (PLD) method, a molecular beam epitaxy (MBE) method, the CVD method, a metal organic chemical vapor deposition (MOCVD) method and an atomic layer deposition (ALD) method.

Likewise, the silicon oxide film, which is one layer in the block insulating film 104, may be formed by, instead of the MOCVD method, the ALD method using BTBAS [bis(tertiary butyl amino)silane: $SiH_2$ (t-$BuNH_2$)$_2$] and ozone ($O_3$) or using 3DMAS ($SiH(N(CH_3)_2)_3$) and ozone ($O_3$) as source gases in a temperature range of 200 to 500° C. Moreover, as the polysilicon film used as the control gate electrode 105, it is possible to use p-type polysilicon doped with boron instead of n-type polysilicon doped with phosphorus.

Furthermore, the source gases used in the CVD method can be replaced with other gases for the layers constituting the MONOS type gate structure described above. The CVD method can also be replaced with the sputtering method. Moreover, the above-described layers can be formed by, instead of the CVD method or the sputtering method, a method such as a vapor deposition method, a laser ablation method, the MBE method, or a combination of these methods.

As described above in detail, in the present embodiment, the block insulating film (second insulating film) 104 disposed between the charge storage layer 103 and the control gate electrode 105 is formed by the stacked insulating film including at least one lanthanum aluminum silicate film and at least one dielectric film (a silicon oxide film or silicon oxynitride film).

In consequence, according to the present embodiment, the leakage current can be suppressed both in the high field region and the low field region. Specifically, the leakage current in the high field region can be suppressed by the lanthanum aluminum silicate film, and the leakage current in the low field region can be suppressed by the silicon oxide film (or silicon oxynitride film).

Furthermore, the lanthanum aluminum silicate film can maintain the amorphous state even when the nonvolatile semiconductor memory device is subjected to a high-temperature heat treatment at about 900 to 1000° C. This makes it possible to construct a nonvolatile semiconductor memory device having a high thermal stability and high reliability.

Still further, the lanthanum aluminum silicate film, which is a high-dielectric-constant insulating film, is used for part of the second insulating film 104, such that the EOT of the second insulating film 104 can be reduced. This allows a reduction in the operating voltage (write voltage, erasing voltage) of the memory cell.

[Second Embodiment]
<1. Configuration of Nonvolatile Semiconductor Memory Device>

Figure 22:
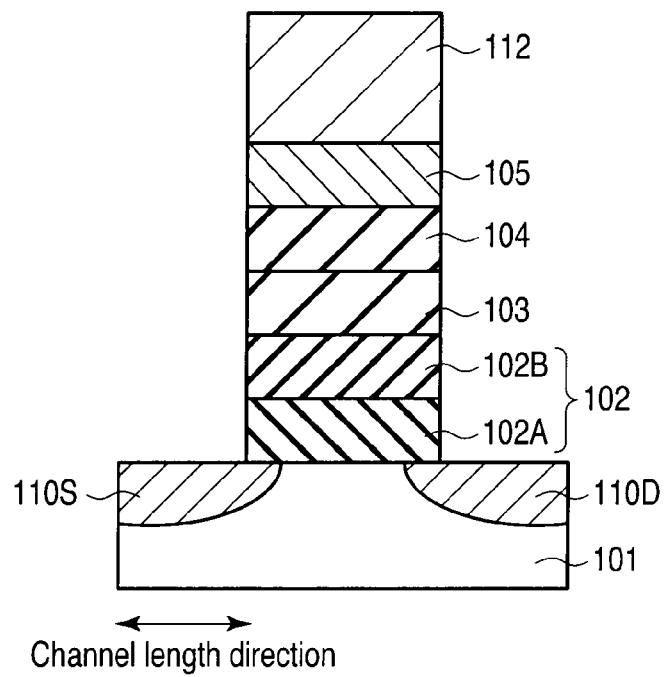
FIG. 22 is a sectional view in a channel length direction showing the configuration of a nonvolatile semiconductor memory device according to a second embodiment.
Figure 23:
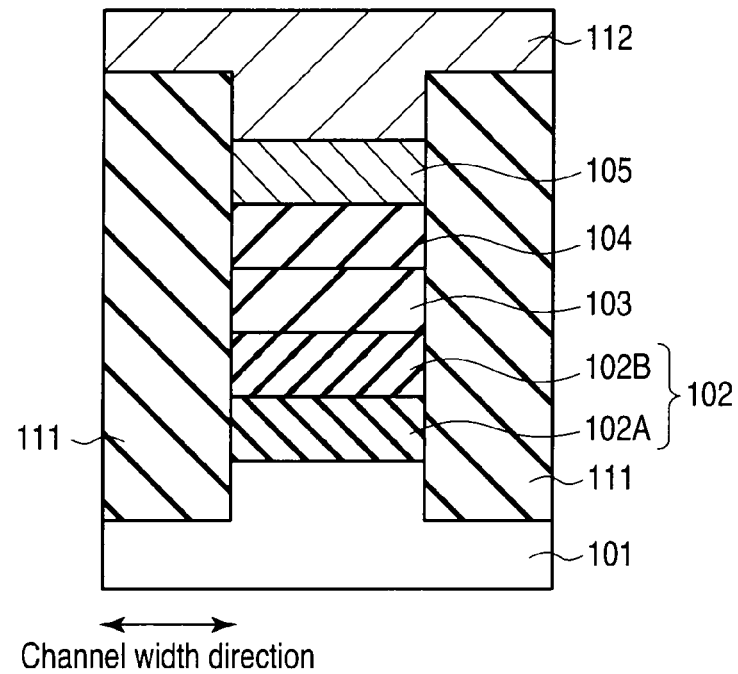
FIG. 23 is a sectional view in a channel width direction showing the configuration of the nonvolatile semiconductor memory device according to the second embodiment.

A second embodiment of the present invention is described below in detail with the drawings. FIGS. 22 and 23 are sectional views showing the configuration of a nonvolatile semiconductor memory device according to a second embodiment. FIG. 22 is a sectional view in a channel length direction and FIG. 23 is a sectional view in a channel width direction.

A source region 110S and a drain region 110D are provided apart from each other in a surface region of a silicon substrate (including a well) 101 doped with a p-type impurity. On the channel region between the source region 110S and the drain region 110D, a tunnel insulating film (first insulating film) 102 is provided.

FIGS. 24A to 24D are schematic diagrams showing the extracted tunnel insulating film 102. A first example (FIG. 24A) of the tunnel insulating film 102 comprises a stacked insulating film (LO structure) composed of a lanthanum aluminum silicate film (LASO) 102A having a thickness of about 8 nm and a silicon oxide film ($SiO_2$) 102B having a thickness of about 3 nm. A second example (FIG. 24B) of the tunnel insulating film 102 comprises a stacked insulating film (OL structure) composed of a silicon oxide film ($SiO_2$) 102B having a thickness of about 3 nm and a lanthanum aluminum silicate film (LASO) 102A having a thickness of about 8 nm. A third example (FIG. 24C) of the tunnel insulating film 102 comprises a stacked insulating film (OLO structure) composed of a silicon oxide film ($SiO_2$) 102B having a thickness of about 1.5 nm, a lanthanum aluminum silicate film (LASO) 102A having a thickness of about 8 nm, and a silicon oxide film ($SiO_2$) 102C having a thickness of about 1.5 nm. A fourth example (FIG. 24D) of the tunnel insulating film 102 comprises a stacked insulating film (LOL structure) composed of a lanthanum aluminum silicate film (LASO) 102A having a thickness of about 4 nm, a silicon oxide film ($SiO_2$) 102B having a thickness of about 3 nm, and a lanthanum aluminum silicate film (LASO) 102D having a thickness of about 4 nm.

A silicon oxynitride film in which a silicon oxide film is doped with nitrogen, a stacked film of a silicon oxide film/a silicon oxynitride film, and a stacked film of a silicon oxynitride film/a silicon oxide film may be used instead of the silicon oxide film to constitute the above-mentioned tunnel insulating film 102. The use of the silicon oxynitride film for the tunnel insulating film 102 reduces a potential barrier to a hole, which provides an advantage of accelerated erasing operation of a memory cell.

A silicon nitride film ($Si_3N_4$) 103 having a thickness of, for example, 6 nm is provided on the tunnel insulating film 102 as a charge storage layer 103. Instead of the silicon nitride film, the insulating material illustrated in the first embodiment may be used as the charge storage layer 103. Moreover, the memory cell is not limited to the MONOS type memory cell in which the charge storage layer 103 is made of an insulator, and the memory cell may be a floating gate type memory cell in which the charge storage layer 103 is made of a conductor such as polysilicon.

A silicon oxide film 104 having a thickness of, for example, about 4 nm is provided as a block insulating film (second insulating film) 104 on the charge storage layer 103. As the block insulating film 104, a stacked structure of a silicon oxide film and a lanthanum aluminum silicate film as shown in the first embodiment can also be used.

On the block insulating film 104, a control gate electrode 105 about 100 nm thick which is made of polysilicon doped with, for example, an n-type impurity is provided. A low-resistance metal layer 112 of, for example, tungsten (W) having a thickness of about 100 nm is provided on the control gate electrode 105. A plurality of stacked gate structures composed of the tunnel insulating film 102, the charge storage layer 103, the block insulating film 104 and the control gate electrode 105 are arranged in a row direction. These structures are isolated from each other by element isolation insulating layers 111 made of, for example, STI. The low-resistance metal layer 112 extends in the row direction and functions as a word line.

Instead of the materials illustrated above, the same materials as the materials shown in the first embodiment can be widely used as the materials of the charge storage layer 103, the block insulating film 104 and the control gate electrode 105.

<2. Function of Tunnel Insulating Film (First Insulating Film) 102>

The following advantage is provided when the first insulating film 102 is structured by a stack of a lanthanum aluminum silicate film and a silicon oxide film.

As in FIG. 24A, when the lanthanum aluminum silicate film is inserted onto the side of the silicon substrate, the silicon oxide film is located on the side of the charge storage layer (or the floating gate electrode), so that a charge does not easily escape from the charge storage layer (or the floating gate electrode). That is, charge retention characteristics are improved.

As in FIG. 24B, when the silicon oxide film is inserted onto the side of the silicon substrate, defects of the interface between the first insulating film 102 and the silicon substrate can be reduced, and therefore the performance of a memory cell transistor does not deteriorate.

As in FIG. 24C, when the silicon oxide films are inserted onto both the side of the silicon substrate and the side of the charge storage layer (or the floating gate electrode), it is possible to achieve both an improvement in interfacial characteristics and inhibition of escaping charge.

The thickness of the lanthanum aluminum silicate film and the thickness of the silicon oxide film are desirably 2 nm or more considering that a significant direct tunnel effect is obtained when the thickness of the silicon oxide film is 2 nm. However, about 8 nm or more is enough for the total thickness of the lanthanum aluminum silicate film and the silicon oxide films if the inhibition of a low field leak of, for example, stress induced leakage current (SILC) is taken into account. That is, the thickness of the silicon oxide film and the thickness of LASO are desirably about 2 to 8 nm.

The dielectric constant of the whole tunnel insulating film 102 increases by including the lanthanum aluminum silicate film therein. This enables not only low-voltage operation of the memory cell but also faster writing and erasing operations owing to the band gap of the lanthanum aluminum silicate film, which is smaller than that of the silicon oxide film.

For example, when the lanthanum aluminum silicate film is directly joined to the silicon substrate 101, the writing operation becomes faster. On the other hand, when the lanthanum aluminum silicate film is directly joined to the charge storage layer 103, the erasing operation becomes faster. The LOL structure shown in FIG. 24D is desirable for the acceleration of both the writing and erasing operations. However, electric properties of the interface between $SiO_2$ and the Si substrate are stable, so that the OL structure (FIG. 24B) or the OLO structure (FIG. 24C) is desirable to increase reliability.

The advantage of being able to inhibit the leakage current in the high field region and the low field region of the tunnel insulating film 102 is the same as the advantage of the block insulating film 104 described in the first embodiment.

<3. Method of Manufacturing Nonvolatile Semiconductor Memory Device>

A method of manufacturing the nonvolatile semiconductor memory device according to the present embodiment is described. Of the drawings used for the explanation of the manufacturing method, FIGS. 25 to 36 are sectional views in the channel width direction (row direction), and FIGS. 37 to 40 are sectional views in the channel length direction (column direction).

First, as shown in FIG. 25, the upper surface of a silicon substrate (including a well) 101 doped with a p-type impurity is washed, and then a silicon oxide film 102B having a thickness of about 4 nm is formed by a thermal oxidation method in a temperature range of 800 to 1000° C. Then, as shown in FIG. 26, a lanthanum aluminum silicate film 102A is formed by, for example, the sputtering method in a temperature range of 200 to 700° C. Thus, a stacked insulating film composed of the lanthanum aluminum silicate film/the silicon oxide film (OL structure) serving as the tunnel insulating film (first insulating film) 102 is formed.

Although the OL structure is shown in FIG. 26, the LO structure of a silicon oxide film/a lanthanum aluminum silicate film, the LOL structure of a lanthanum aluminum silicate film/a silicon oxide film/a lanthanum aluminum silicate film, or the OLO structure of a silicon oxide film/a lanthanum aluminum silicate film/a silicon oxide film can be formed by applying the film formation method for the OL structure and changing the order of forming films and the number of forming films. Moreover, a silicon oxynitride film in which a silicon oxide film is doped with nitrogen, a stacked insulating film of a silicon oxide film/a silicon oxynitride film, and a stacked insulating film of a silicon oxynitride film/a silicon oxide film may be used instead of the silicon oxide film to constitute the above-mentioned tunnel insulating film 102.

Figure 27:
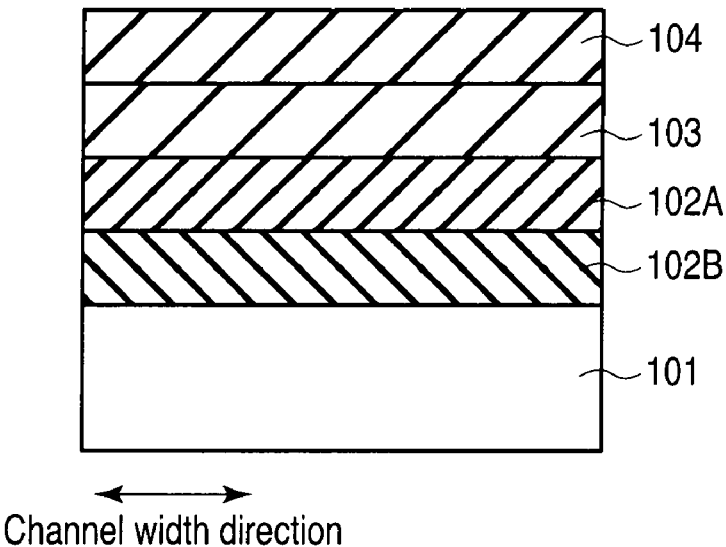

Then, as shown in FIG. 27, a silicon nitride film (charge storage layer) 103 having a thickness of about 6 nm is formed on the tunnel insulating film 102 by the LPCVD method using dichlorosilane ($SiH_2Cl_2$) and ammonia ($NH_3$) as source gases in a temperature range of 600 to 800° C. Then, a silicon oxide film (block insulating film) 104 having a thickness of about 3 nm is formed on the charge storage layer 103 by the LPCVD method using dichlorosilane ($SiH_2Cl_2$) and nitrous oxide ($N_2O$) as source gases in a temperature range of 600 to 800° C.

Figure 28:
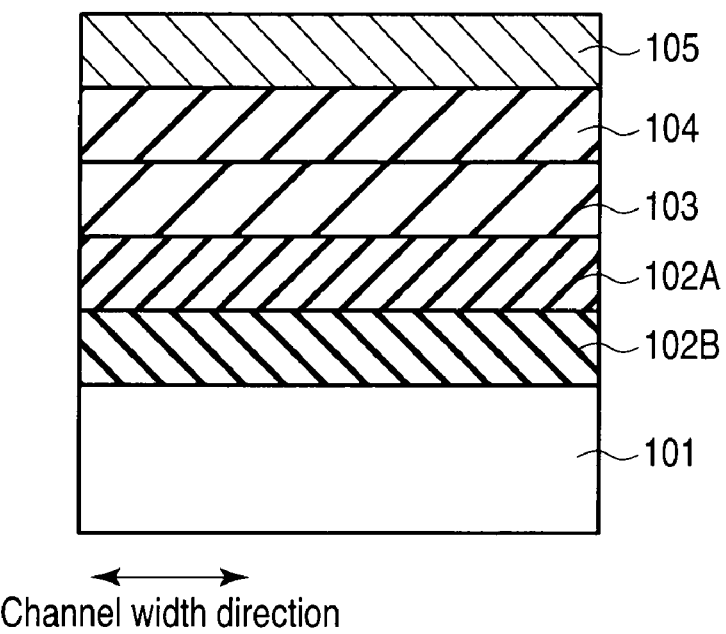

Then, as shown in FIG. 28, a polysilicon film (amorphous silicon film in the case of a low formation temperature) 105 as a control gate electrode 105 doped with an n-type impurity is formed by the LPCVD method using silane ($SiH_4$) and phosphine ($Ph_3$) as source gases in a temperature range of 550 to 700° C.

Then, as shown in FIG. 29, a mask layer 120 for fabricating an element isolation region is formed on the polysilicon film 105. An insulator, for example, is used as the mask layer 120. Then, a photoresist (not shown) is formed on the mask layer 120, and this photoresist is exposed and developed. Then, as shown in FIG. 30, a pattern in the photoresist is transferred to the mask layer 120 by, for example, the RIE method. Then, the photoresist is removed.

Then, as shown in FIG. 31, the control gate electrode 105, the block insulating film 104, the charge storage layer 103 and the tunnel insulating film 102 (102A, 102B) are sequentially etched by the RIE method using the mask layer 120 as a mask, thereby forming a plurality of slits 121A which separate memory cells adjacent in the row direction from each other. Further, as shown in FIG. 32, the silicon substrate 101 is etched by the RIE method, and a plurality of element isolation trenches 121B about 100 nm deep are formed in the silicon substrate 101.

Figure 33:
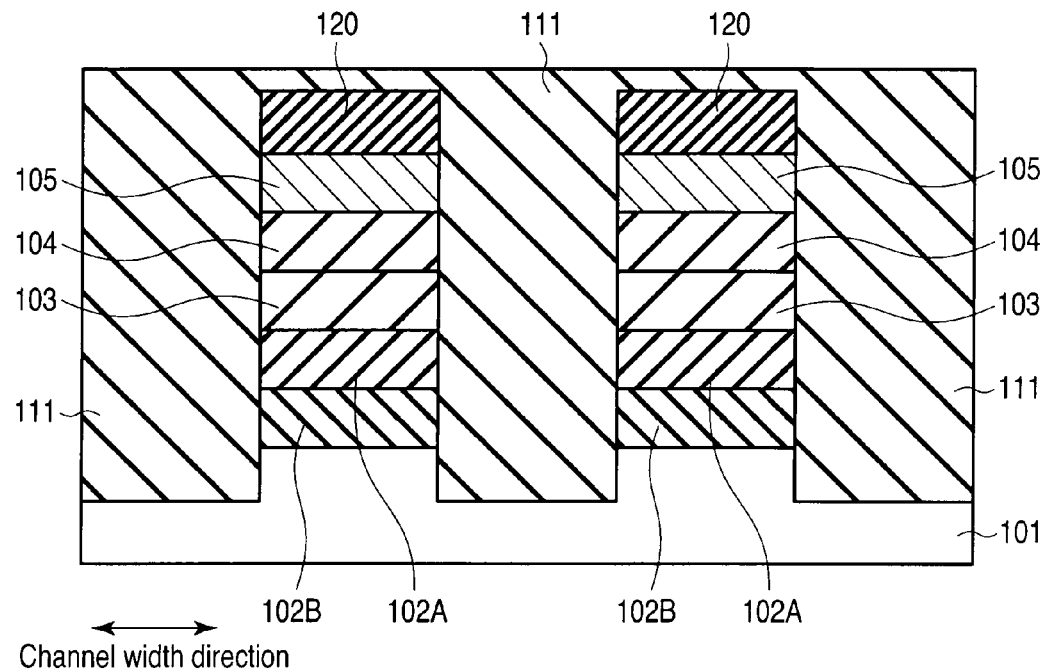
Figure 34:
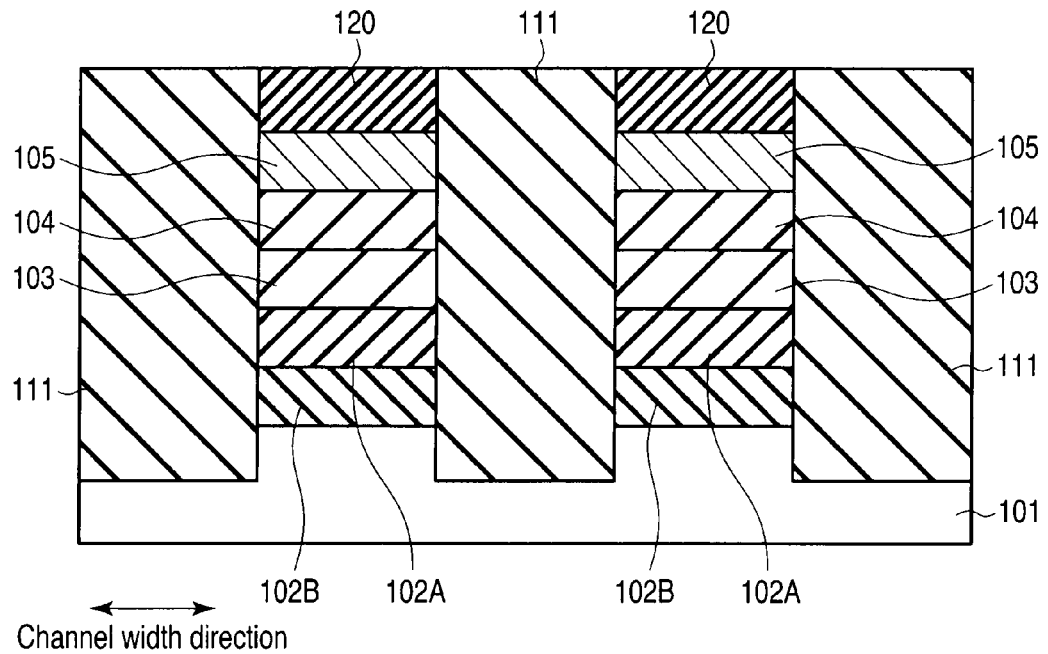
Figure 35:
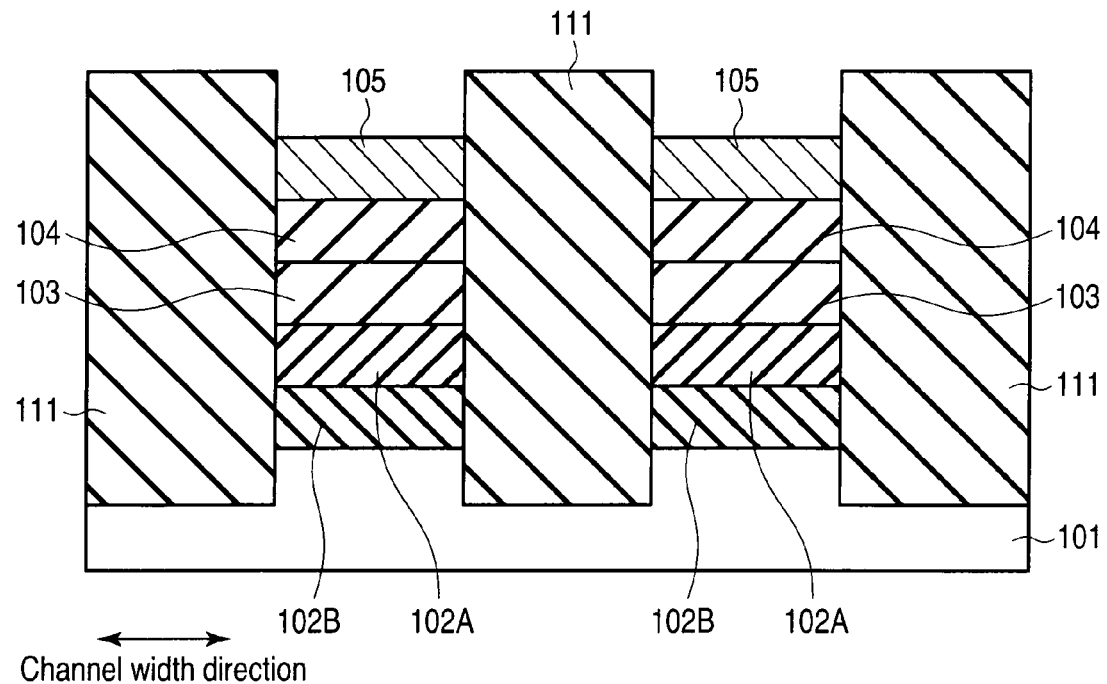

Then, as shown in FIG. 33, a silicon oxide film (buried oxide film) 111 completely filling the slits 121A and the element isolation trenches 121B is formed by, for example, a CVD method. Then, as shown in FIG. 34, the silicon oxide film 111 is polished by the CMP method until the mask layer 120 is exposed, so that the upper surface of the silicon oxide film 111 is planarized. Then, as shown in FIG. 35, the mask layer 120 is removed.

Figure 36:
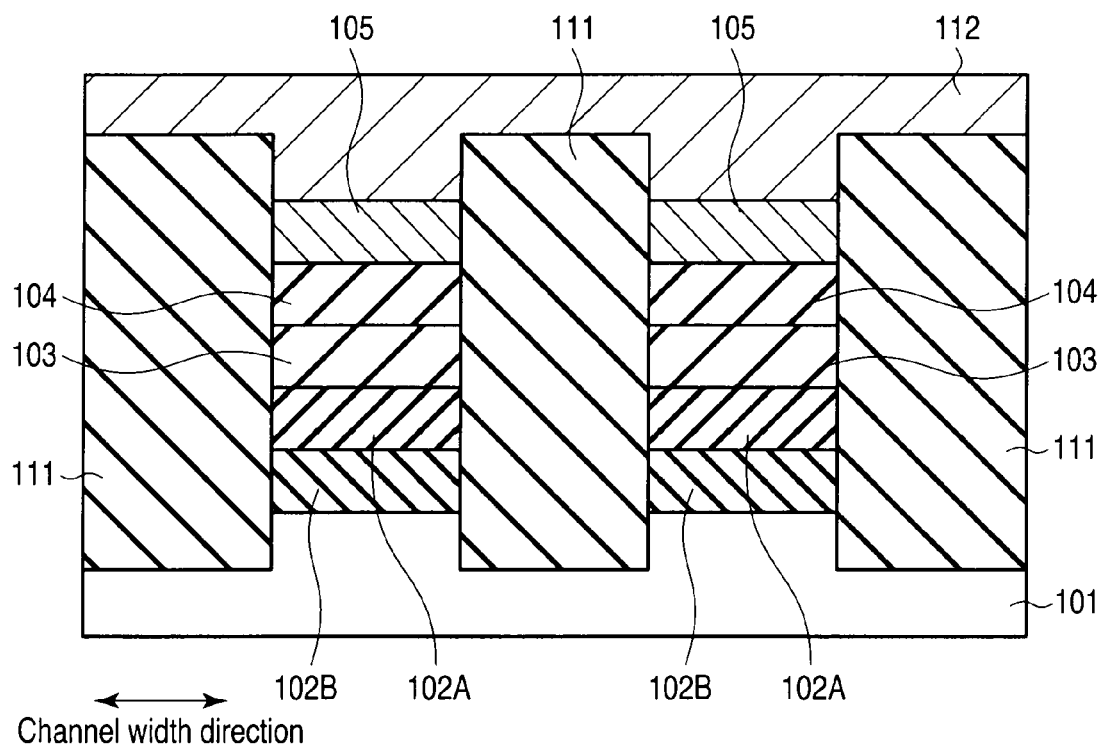

Then, as shown in FIG. 36, a low-resistance metal layer (word line) 112 of, for example, tungsten (W) having a thickness of about 100 nm is formed on the control gate electrode 105 by the CVD method using $WF_6$ or $W(CO)_6$ as a source gas in a temperature range of 400 to 600° C.

Then, as shown in FIG. 37, a mask layer 122 is formed on the low-resistance metal layer 112 by, for example, the CVD method. An insulator, for example, is used as the mask layer 122. A photoresist (not shown) is formed on the mask layer 122, and the photoresist is exposed and developed. Then, as shown in FIG. 38, a pattern in the photoresist is transferred to the mask layer 122 by, for example, the RIE method. Then, the photoresist is removed.

Then, as shown in FIG. 39, the low-resistance metal layer 112, the control gate electrode 105, the block insulating film 104, the charge storage layer 103 and the tunnel insulating film 102 (102A, 102B) are sequentially etched by the RIE method using the mask layer 122 as a mask, thereby forming a MONOS type gate structure.

Then, as shown in FIG. 40, the side surface of the MONOS type gate structure, for example, is covered with, for example, a silicon oxide film (not shown) by the CVD method, and then an $n^+$-type diffusion region 110 (including a source region 110S and a drain region 110D) is formed on the surface region of the silicon substrate 101 by an ion implantation method in a self-aligning manner. Thus, memory cells constituting the nonvolatile semiconductor memory device are formed. Finally, an interlayer insulating film (not shown) covering the memory cells is formed by, for example, the CVD method.

The manufacturing method described above is illustrative only, and a nonvolatile semiconductor memory device may be formed by any other manufacturing method. For example, as the thermal oxidation method for the tunnel insulating film 102, it is possible to use not only dry $O_2$ oxidation but also various other methods, such as wet oxidation (hydrogen burning oxidation), plasma oxidation using $O_2$ and $H_2O$ as source gases. Moreover, it is possible to insert, before or after the thermal oxidation, the step of providing an NO gas, an $NH_3$ gas or nitrogen plasma, in order to form a nitrided silicon oxide film (silicon oxynitride film).

Furthermore, the composition of the silicon nitride film used as the charge storage layer 103 can be changed by adjusting the ratio of the flow volumes of dichlorosilane ($SiH_2Cl_2$) and ammonia ($NH_3$) which are the source gases in the LPCVD method. Moreover, for the polysilicon film used as the control gate electrode 105, it is possible to use p-type polysilicon doped with boron instead of n-type polysilicon doped with phosphorus.

Furthermore, the source gases used in the CVD method can be replaced with other gases for the layers constituting the MONOS type gate structure described above. The CVD method can also be replaced with the sputtering method. Moreover, the above-described layers can be formed by, instead of the CVD method or the sputtering method, a method such as a vapor deposition method, a laser ablation method, the MBE method, or a combination of these methods.

As described above in detail, in the present embodiment, the tunnel insulating film (first insulating film) 102 disposed between the silicon substrate 101 and the charge storage layer 103 is formed by the stacked insulating film including at least one lanthanum aluminum silicate film and at least one dielectric film (a silicon oxide film or silicon oxynitride film).

In consequence, according to the present embodiment, the leakage current can be suppressed both in the high field region and the low field region. Specifically, the leakage current in the high field region can be suppressed by the lanthanum aluminum silicate film, and the leakage current in the low field region can be suppressed by the silicon oxide film (or silicon oxynitride film).

Furthermore, the lanthanum aluminum silicate film can maintain the amorphous state even when the nonvolatile semiconductor memory device is subjected to a high-temperature heat treatment at about 900 to 1000° C. This makes it possible to construct a nonvolatile semiconductor memory device having a high thermal stability and high reliability.

Still further, the lanthanum aluminum silicate film, which is a high-dielectric-constant insulating film, is used for part of the first insulating film 102, such that the dielectric constant of the first insulating film 102 increases. This allows a reduction in the operating voltage (write voltage, erasing voltage) of the memory cell, and a further acceleration of both the writing and erasing operations.

[Application]

The present embodiment is applicable to a nonvolatile semiconductor memory having a memory cell including a charge storage layer made of an insulator or conductor, in particular, to a flash memory having a NAND type element configuration.

Although a silicon nitride film is shown as an example of the charge storage layer, the charge storage layer is not necessarily limited to the silicon nitride film, and a high-dielectric-constant insulating film is also applicable to the charge storage layer. For example, the charge storage layer may be formed by an Hf-based insulating film, to which nitrogen may be added. Further, a stacked film or continuous film of a high-dielectric-constant insulating film and a silicon nitride film is also applicable to the charge storage layer.

Furthermore, the charge storage layer does not necessarily have to be an insulating film having a finite thickness. For example, the present embodiment is also applicable to an "interface-trap type memory" in which a charge-trap center present between a tunnel insulating film and a block insulating film is used in place of a charge storage layer.

Still further, the present embodiment is not exclusively applied to a memory cell of the MONOS type or silicon-oxide-nitride-oxide-silicon (SONOS) type. Thus, a first insulating film and a second insulating film in the present embodiment are also applicable to a tunnel insulating film and an intergate insulating film in, for example, a floating gate type memory cell. The present embodiment is also applicable to a tunnel insulating film and a block insulating film in a nanodot type memory cell.

Further yet, the present embodiment is characterized in the configuration of the first insulating film and the second insulating film, so that the stacked gate structure according to the present embodiment can be used regardless of a dopant impurity distribution on the substrate side. Therefore, the present embodiment is also effective in, for example, a D-type NAND flash memory in which a memory cell has no source/drain diffusion layer.

From the same point of view, the stacked gate structure according to the present embodiment does not necessarily have to be formed on the silicon (Si) substrate. For example, the stacked gate structure according to the present embodiment may be formed on a well region formed on the silicon substrate. Instead of the silicon substrate, an SiGe substrate, Ge substrate or SiGeC substrate may be used. The stacked gate structure according to the present embodiment may be formed on a well region on such a substrate. Moreover, it is also possible to use a silicon on insulator (SOI) substrate, a silicon-germanium on insulator (SGOI) substrate or a germanium on insulator (GOI) substrate in which a thin-film semiconductor is formed on an insulating film. The stacked gate structure according to the present embodiment may be formed on a well region on such a substrate.

Furthermore, while the memory cell comprising an n-channel metal oxide semiconductor (MOS) transistor formed on the p-type silicon substrate (including a well) has been described in the present embodiment, it can be replaced with a memory cell comprising a p-channel MOS transistor formed on an n-type silicon substrate (including a well). In this case, the conductivity type of a source region and a drain region is p.

Still further, the present embodiment concerns an invention associated with an element technique in a memory cell and is not dependent on the fashion of connection on the circuit level of the memory cell. Thus, the present embodiment is widely applicable not only to a NAND type nonvolatile semiconductor memory but also to a NOR type, AND type or divided bit-line NOR (DINOR) type nonvolatile semiconductor memory, a 2-transistor (Tr) type flash memory combining the advantages of the NOR type and NAND type, or a 3-Tr NAND type flash memory having a structure in which one memory cell is interposed between two selective transistors.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a source region and a drain region provided apart from each other in a semiconductor portion;
   a first insulating film provided on a channel region between the source region and the drain region;
   a charge storage layer provided on the first insulating film;
   a second insulating film provided on the charge storage layer and including a first silicon oxynitride film, a second silicon oxynitride film and a lanthanum aluminum silicate film sandwiched between the first silicon oxynitride film and the second silicon oxynitride film; and
   a control gate electrode provided on the second insulating film.

2. The device according to claim 1, wherein the charge storage layer is made of a conductor.

3. The device according to claim 1, wherein the charge storage layer is made of an insulator.

4. A nonvolatile semiconductor memory device comprising:
   a source region and a drain region provided apart from each other in a semiconductor portion;
   a first insulating film provided on a channel region between the source region and the drain region;
   a charge storage layer provided on the first insulating film;
   a second insulating film provided on the charge storage layer and including a stacked structure of a first silicon oxynitride film, a first silicon oxide film, a lanthanum aluminum silicate film, a second silicon oxide film and a second silicon oxynitride film; and
   a control gate electrode provided on the second insulating film.

5. The device according to claim 4, wherein the charge storage layer is made of a conductor.

6. The device according to claim 4, wherein the charge storage layer is made of an insulator.

* * * * *